US011233134B2

(12) United States Patent
Chu et al.

(10) Patent No.: US 11,233,134 B2
(45) Date of Patent: Jan. 25, 2022

(54) FIELD EFFECT TRANSISTORS WITH DUAL SILICIDE CONTACT STRUCTURES

(71) Applicant: Taiwan Semiconductor Manufacturing Co., Ltd., Hsinchu (TW)

(72) Inventors: Peng-Wei Chu, Hsinchu (TW); Ding-Kang Shih, New Taipei (TW); Sung-Li Wang, Hsinchu County (TW); Yasutoshi Okuno, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 9 days.

(21) Appl. No.: 16/721,352

(22) Filed: Dec. 19, 2019

(65) Prior Publication Data
US 2021/0193816 A1 Jun. 24, 2021

(51) Int. Cl.
*H01L 29/66* (2006.01)
*H01L 21/8238* (2006.01)
(Continued)

(52) U.S. Cl.
CPC ........ *H01L 29/665* (2013.01); *H01L 21/0206* (2013.01); *H01L 21/02236* (2013.01);
(Continued)

(58) Field of Classification Search
CPC ..... H01L 29/655; H01L 29/165; H01L 29/45; H01L 29/0847; H01L 29/6656;
(Continued)

(56) References Cited

U.S. PATENT DOCUMENTS

| 5,856,237 A | 1/1999 | Ku |
| 6,204,170 B1 | 3/2001 | Taguwa |

(Continued)

FOREIGN PATENT DOCUMENTS

| KR | 20000000869 A | 1/2000 |
| KR | 100538806 B1 | 12/2005 |

(Continued)

OTHER PUBLICATIONS

U.S. Appl. No. 16/251,841, "Semiconductor Structure and Method for Manufacturing the Same," to Wang et al., filed Jan. 18, 2019.
(Continued)

*Primary Examiner* — Dao H Nguyen
(74) *Attorney, Agent, or Firm* — Sterne, Kessler, Goldstein & Fox P.L.L.C.

(57) ABSTRACT

The structure of a semiconductor device with dual silicide contact structures and a method of fabricating the semiconductor device are disclosed. A method of fabricating the semiconductor device includes forming first and second fin structures on a substrate, forming first and second epitaxial regions on the first and second fin structures, respectively, forming first and second contact openings on the first and second epitaxial regions, respectively, selectively forming an oxide capping layer on exposed surfaces of the second epitaxial region, selectively forming a first metal silicide layer on exposed surfaces of the first epitaxial region, removing the oxide capping layer, and forming first and second conductive regions on the metal silicide layer and on the exposed surfaces of the second epitaxial region, respectively. The first metal silicide layer includes a first metal. The first and second conductive regions includes a second metal different from the first metal.

20 Claims, 19 Drawing Sheets

(51) Int. Cl.
*H01L 29/165* (2006.01)
*H01L 29/45* (2006.01)
*H01L 21/02* (2006.01)
*H01L 27/092* (2006.01)
*H01L 29/08* (2006.01)

(52) U.S. Cl.
CPC .............. *H01L 21/02532* (2013.01); *H01L 21/823814* (2013.01); *H01L 21/823821* (2013.01); *H01L 21/823871* (2013.01); *H01L 27/0924* (2013.01); *H01L 29/0847* (2013.01); *H01L 29/165* (2013.01); *H01L 29/45* (2013.01); *H01L 29/6656* (2013.01); *H01L 29/66545* (2013.01); *H01L 21/02576* (2013.01); *H01L 21/02579* (2013.01)

(58) Field of Classification Search
CPC ......... H01L 29/66545; H01L 29/41791; H01L 29/161; H01L 21/823814; H01L 21/823871; H01L 21/823821; H01L 21/0206; H01L 21/02236; H01L 21/02532; H01L 21/02579; H01L 21/02576; H01L 21/31116; H01L 21/0262; H01L 27/0924
USPC ........ 438/197, 268, 283, 300, 592; 257/192, 257/194, 288, 347, 368, 369, 401, 257/E21.165, E21.199, E21.176, E21.19, 257/E21.409, E21.422, E23.149, E23.019, 257/E29.025, E29.081, E29.121, E29.255
See application file for complete search history.

(56) References Cited

U.S. PATENT DOCUMENTS

| | | | |
|---|---|---|---|
| 6,461,960 B2 | 10/2002 | Lee | |
| 7,868,458 B2 | 1/2011 | Lee et al. | |
| 8,772,109 B2 | 7/2014 | Colinge | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,963,258 B2 | 2/2015 | Yu et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,236,345 B2 * | 1/2016 | Alptekin | H01L 23/485 |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,303 B2 | 1/2017 | Lee et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,837,510 B2 | 12/2017 | Chang et al. | |
| 9,859,386 B2 | 1/2018 | Ho et al. | |
| 9,876,112 B2 | 1/2018 | Huang et al. | |
| 10,079,210 B2 | 9/2018 | Lee et al. | |
| 10,428,421 B2 | 10/2019 | Haukka et al. | |
| 2007/0093047 A1* | 4/2007 | Okuno | H01L 21/28052 438/592 |
| 2015/0028399 A1* | 1/2015 | Xiong | H01L 29/7848 257/288 |
| 2015/0132939 A1 | 5/2015 | Hasegawa et al. | |
| 2016/0365446 A1 | 12/2016 | Chang et al. | |
| 2018/0151683 A1* | 5/2018 | Yeo | H01L 29/0847 |
| 2019/0067013 A1 | 2/2019 | Wang et al. | |

FOREIGN PATENT DOCUMENTS

| | | |
|---|---|---|
| KR | 20160062717 A | 6/2016 |
| KR | 20160100181 A | 8/2016 |
| KR | 20170042938 A | 4/2017 |
| TW | 201712140 A | 4/2017 |
| TW | 201724273 A | 7/2017 |
| WO | WO-2017052610 A1 | 3/2017 |

OTHER PUBLICATIONS

U.S. Appl. No. 16/354,259, "Selective Dual Silicide Formation," to Chu et al., filed Mar. 15, 2019.

* cited by examiner

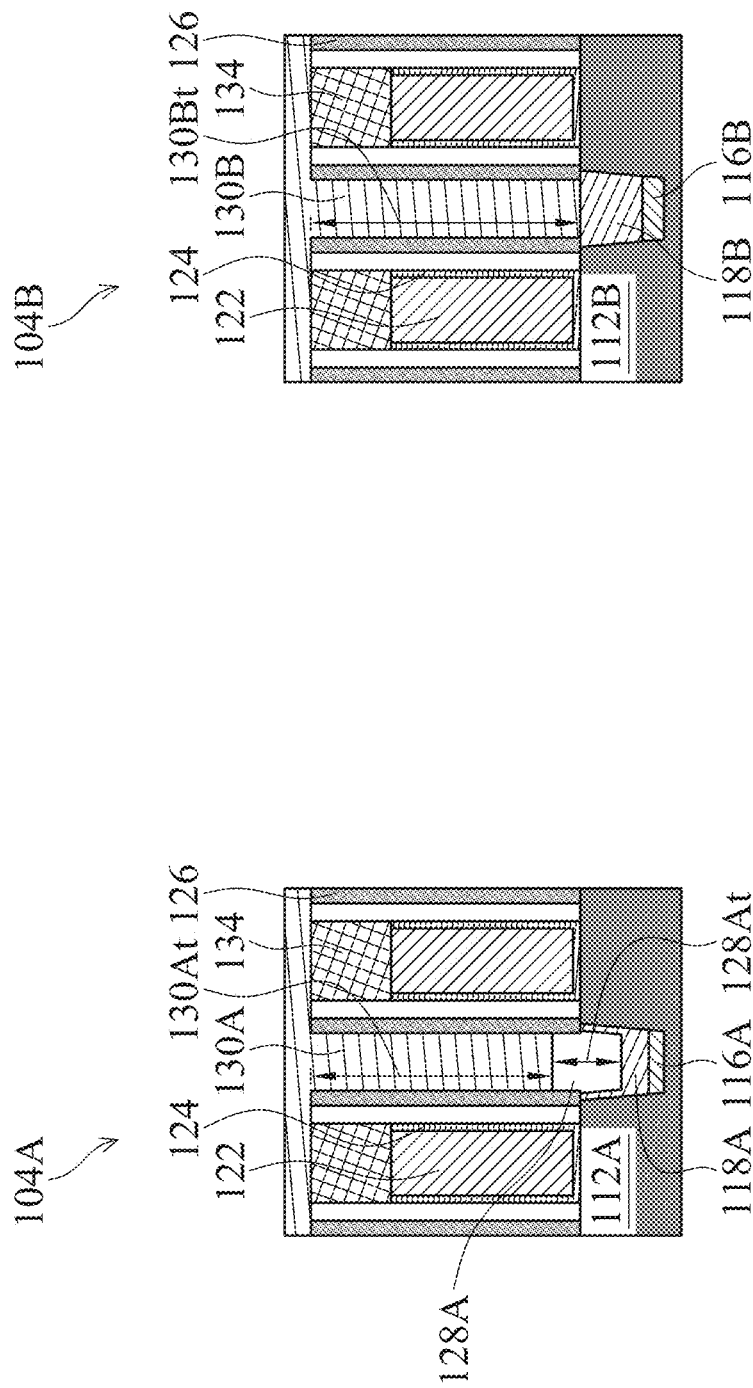

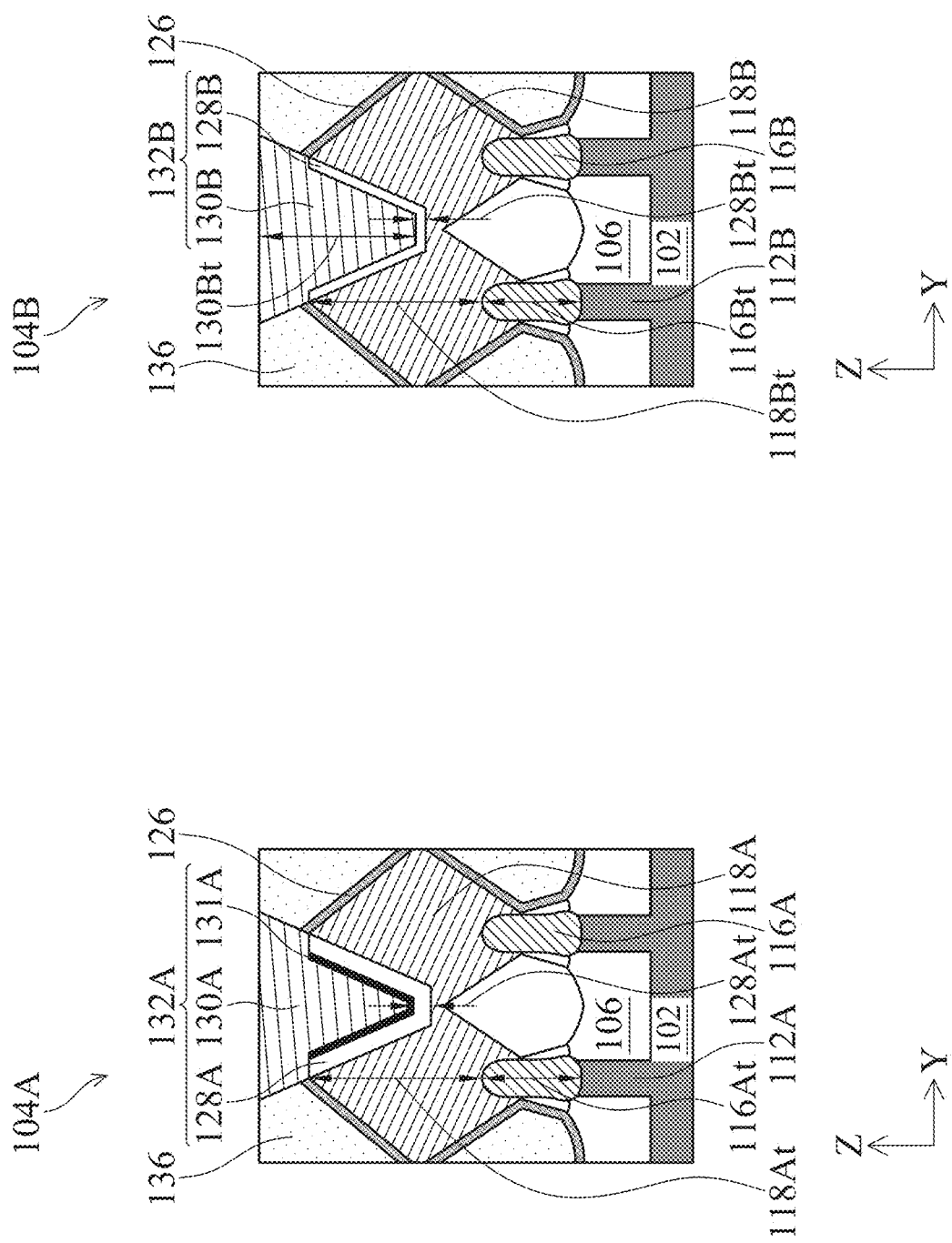

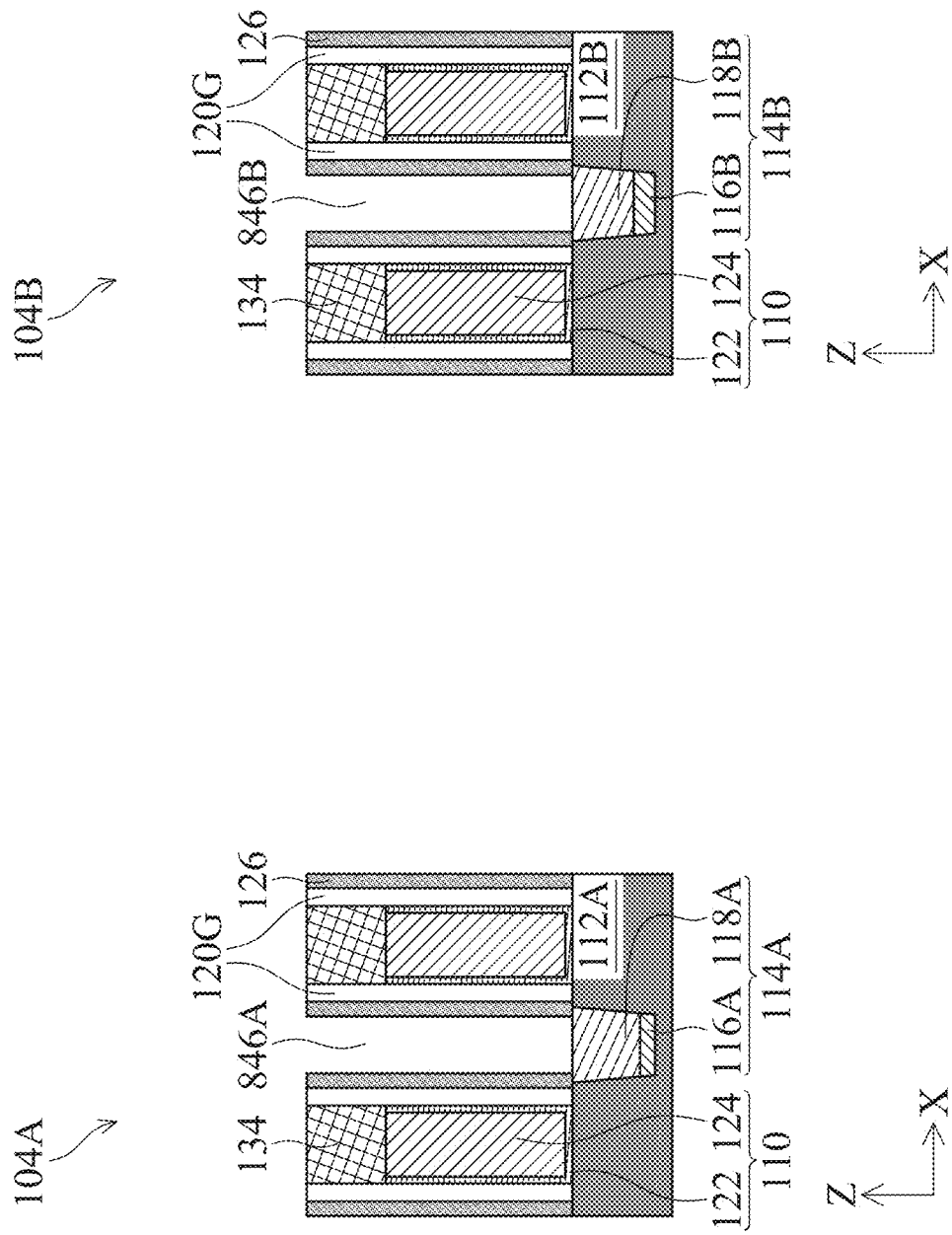

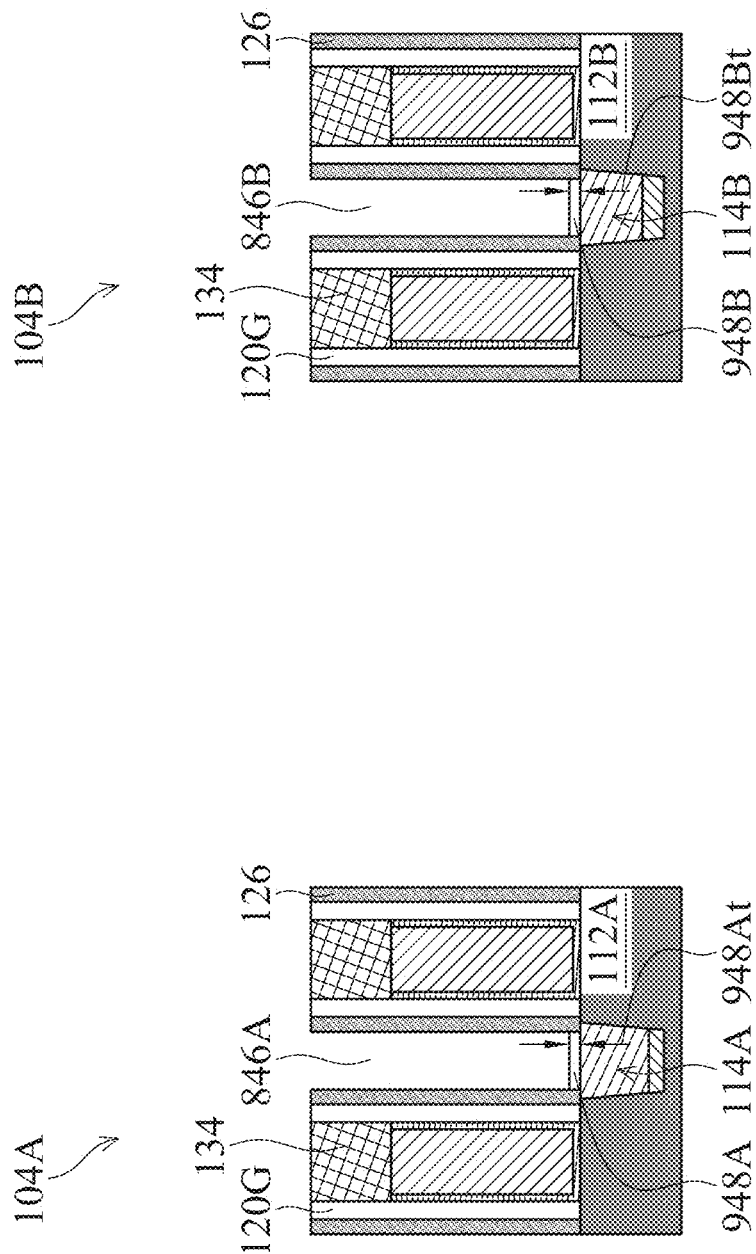

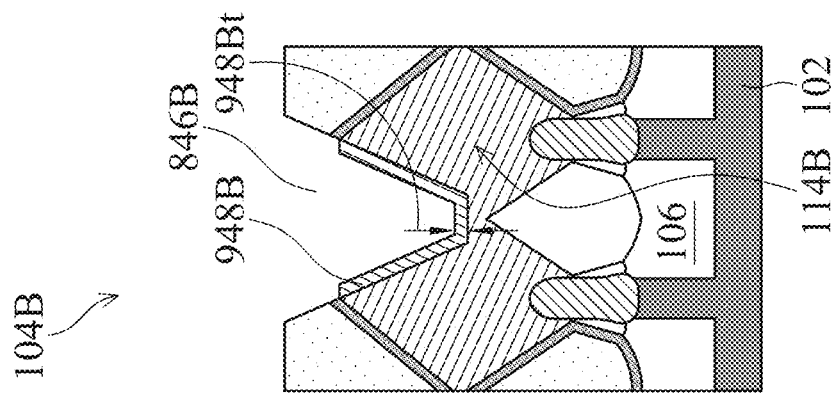
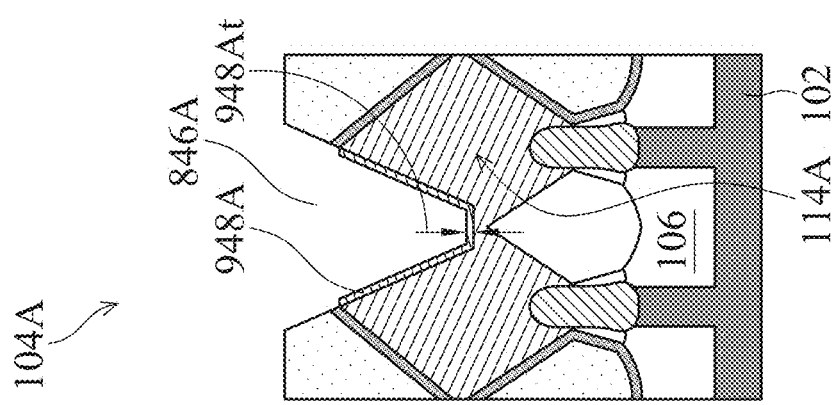

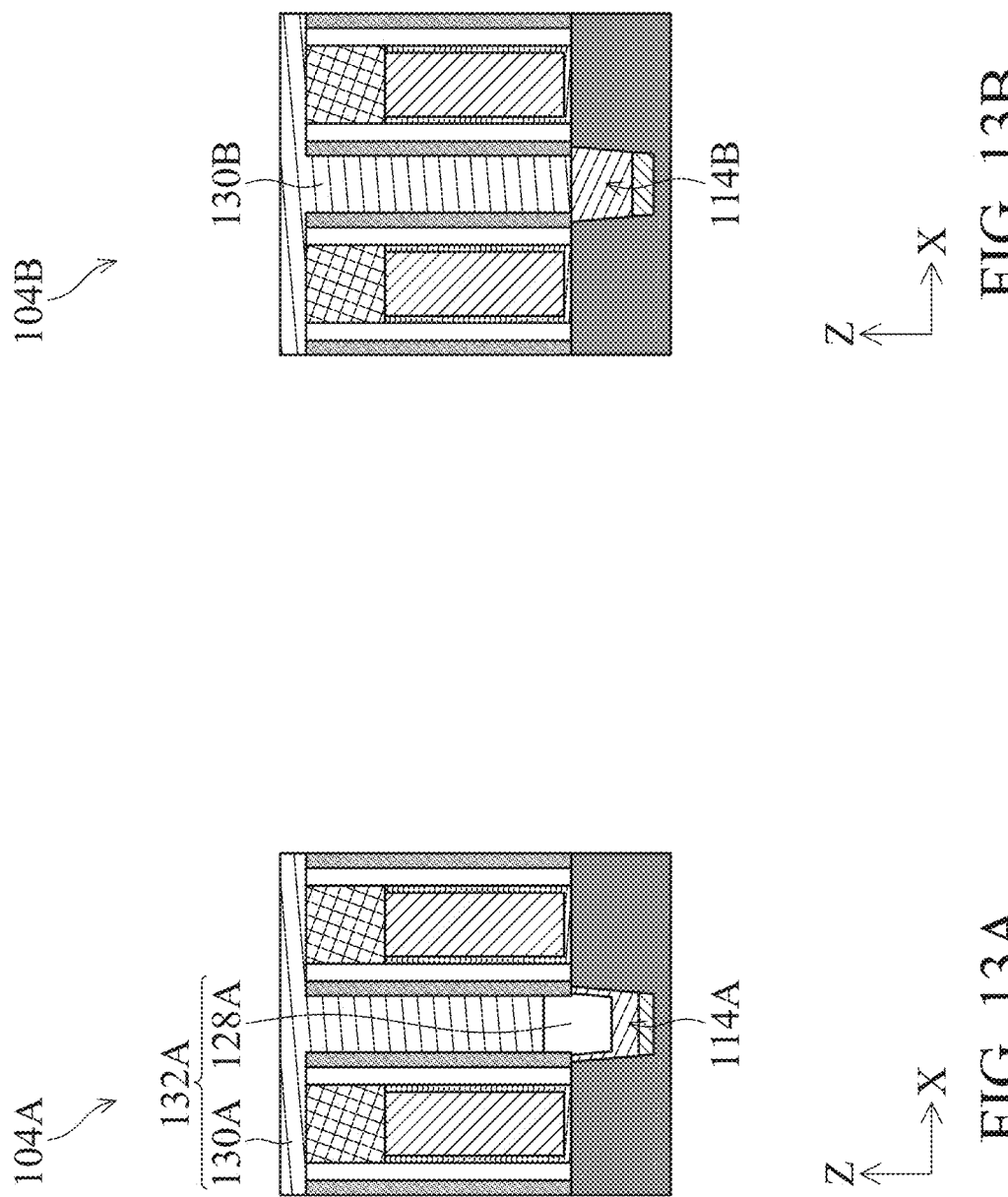

FIELD EFFECT TRANSISTORS WITH DUAL SILICIDE CONTACT STRUCTURES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1 and 2A-2D are isometric and cross-sectional views, respectively, of a semiconductor device with dual silicide contact structures, in accordance with some embodiments.

FIGS. 7 and 8A-13D are cross-sectional views of a semiconductor device with dual silicide contact structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
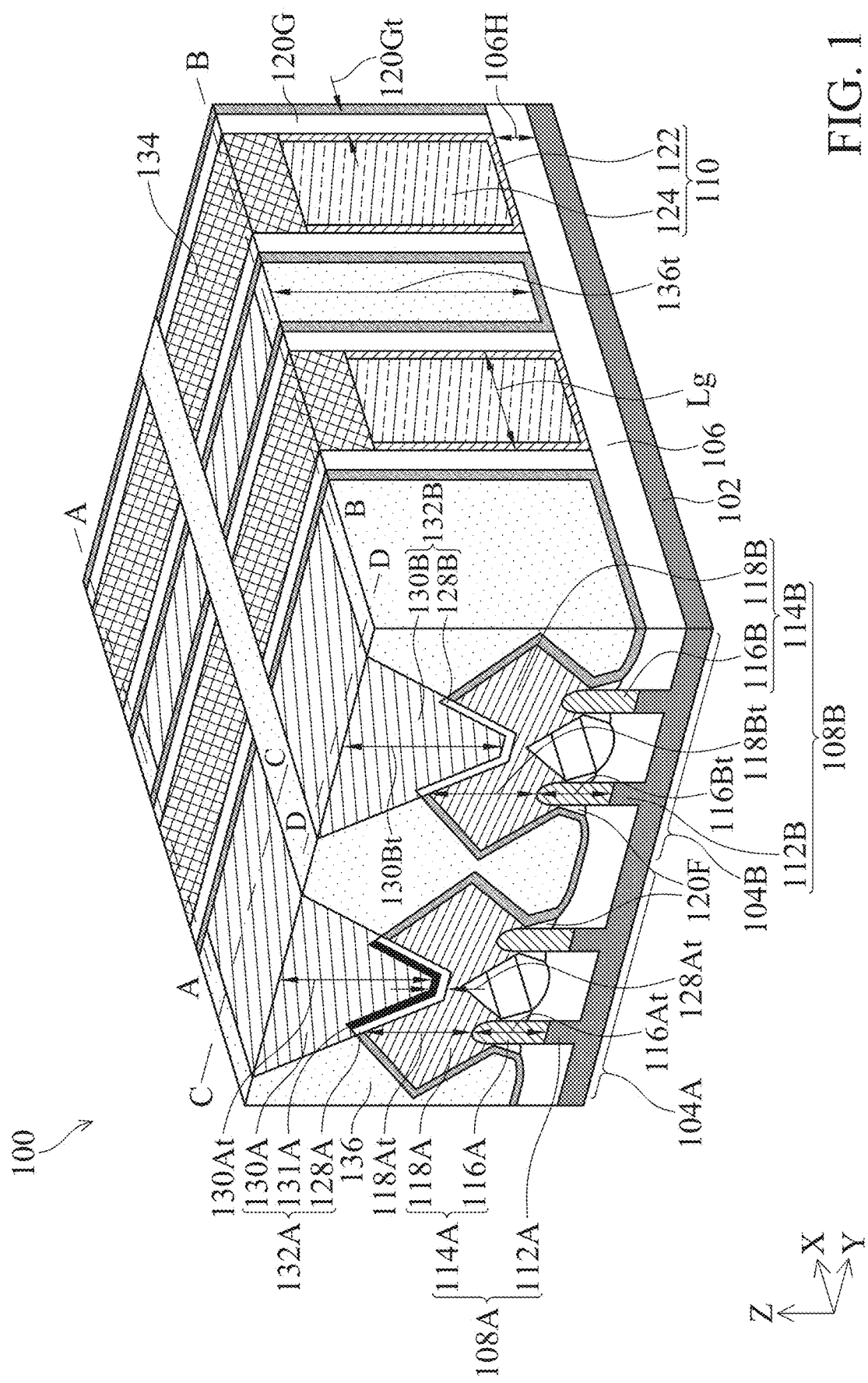

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "deposition selectivity" refers to the ratio of the deposition rates on two different materials or surfaces under the same deposition conditions.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical" means nominally perpendicular to the surface of a substrate.

As used herein, the term "dual silicide contact structures" refers to source/drain contact structures of a semiconductor device with different metal silicides in the source/drain contact structures of n-type FET devices and p-type FET devices.

As used herein, the term "single silicide contact structures" refers to source/drain contact structures of a semiconductor device with the same metal silicides in the source/drain contact structures of n-type FET devices and p-type FET devices.

As used herein, the term "low work function metal" refers to a metal with a work function value equal to or less than 4.5 eV.

As used herein, the term "high work function metal" refers to a metal with a work function value greater than 4.5 eV.

In some embodiments, the terms "about" and "substantially" can indicate a value of a given quantity that varies within 5% of the value (e.g., ±1%, +2%, 3%, +4%, 5% of the value).

The fin structures discloses herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example FET devices (e.g., finFETs, gate-all-around (GAA) FETs, GAA finFETs, or planar FETs) with dual silicide contact structures in a semiconductor device and/or in an integrated circuit (IC) and example methods for fabricating the same.

Source/drain (S/D) contact resistance of a FET device can depend on a Schottky barrier height (SBH) between metal silicide layers of S/D contact structures (also referred to as silicide contact structures) and S/D regions of the FET device. SBH is a potential energy barrier for electrons formed at a metal-semiconductor junction. High SBH can result in high contact resistance. SBH can be dependent on the metal used to form the silicide contact structures. Different silicide contact structures on the same S/D regions of the FET device can have different SBHs and for the same metal used to form the silicide contact structures, n-type FET (NFET) devices and p-type FET (PFET) devices can have different SBHs due to different doping of the S/D regions of the NFET and PFET devices.

For example, for silicide contact structures with silicide layers of a low work function metal (e.g., Ti), NFET devices with cone- or pillar-shaped epitaxial fin regions can have an SBH of about 0.58 eV and PFET devices with cone- or pillar-shaped epitaxial fin regions can have an SBH of about 0.3 eV. For silicide contact structures with silicide layers of high work function metal (e.g., Ni), NFET devices with cone- or pillar-shaped epitaxial fin regions can have an SBH of about 0.77 eV and PFET devices with cone- or pillar-shaped epitaxial fin regions can have an SBH of about 0.2 eV. Thus, NFET and PFET devices can have lower SBHs with low and high work function metal based silicide contact structures, respectively. As such, NFET and PFET devices may not have low SBH and low contact resistance at the same time with the same metal silicides layers in their silicide contact structures.

To achieve low SBH and low contact resistance in both NFET and PFET devices, dual silicide contact structures can be formed in semiconductor devices with NFET and PFET devices using additional mask layers compared to the methods of forming single silicide contact structures in semiconductor devices. The dual silicide contact structures can be selectively formed for NFET and PFET devices with metals suitable for reducing SBHs and contact resistances in the NFET and PFET devices. However, additional patterning, etching, or polishing processes used in the formation of dual silicide contact structures with the additional mask layers can increase the cost and complexity of the semiconductor manufacturing processes.

Various embodiments in accordance with the present disclosure provides methods of forming semiconductor devices with dual silicide contact structures to reduce SBHs and S/D contact resistances of both NFET and PFET devices without using additional mask layers compared to the methods of forming single silicide contact structures in semiconductor devices. According to some embodiments, first silicide contact structures can be selectively formed on S/D regions of the NFET device by using an oxide capping layer on the PFET device. Subsequently, second silicide contact structures that are different from the first silicide contact structures can be formed on S/D regions of the PFET device after the removal of the oxide capping layer. The first silicide contact structures can have silicide layers of a low work function metal (e.g., Ti, Ta, Er, Y, or Yb) and the second silicide contact structures can have silicide layers of a high work function metal (e.g., Ru, Co, Ni, Ir, or Rh) to achieve low SBHs and low S/D contact resistances in the NFET and PFET devices. In accordance with some embodiments, the method of forming the dual silicide contact structures using the oxide capping layer can have the following benefits: (i) selective formation of low work function metal based silicide contact structures on NFET device and high work function metal based silicide contact structures on PFET device for low SBHs and thus low contact resistance of the FET devices; (ii) compatibility with the fabrication process of semiconductor devices with single silicide contact structures without the need for additional mask layers; and (iii) reduced cost and complexity of the semiconductor manufacturing processes compared to the processes for forming dual silicide contact structures using additional mask layers.

A semiconductor device 100 is described with reference to FIGS. 1 and 2A-2D, according to some embodiments. FIG. 1 is an isometric view of semiconductor device 100, according to some embodiments. FIGS. 2A-2D illustrate cross-sectional views along lines A-A, B-B, C-C, and D-D of semiconductor device 100 of FIG. 1, respectively, according to some embodiments. Semiconductor device 100 can be included in a microprocessor, memory cell, or other IC. It will be recognized that the isometric and cross-sectional views of semiconductor device 100 are shown for illustration purposes and may not be drawn to scale.

Semiconductor device 100 can be formed on a substrate 102 and can include finFETs 104A and 104B as shown in FIG. 1. In some embodiments, finFET 104A can be an NFET (also referred to as NFET 104A) and finFET 104B can be a PFET (also referred to as PFET 104B). Though FIG. 1 shows one NFET 104A and one PFET 104B, semiconductor device 100 can have any number of NFETs similar to NFET 104A and any number of PFETs similar to PFET 104B. The discussion of elements of finFET 104A and 104B with the same annotations applies to each other, unless mentioned otherwise. Semiconductor device 100 can further include shallow trench isolation (STI) regions 106, fin structures 108A and 108B, gate structures 110, epitaxial fin regions 114A and 114B, and gate spacers 120G disposed on opposite sides of gate structures 110.

FinFETs 104A and 104B can be formed on a substrate 102. Substrate 102 can be a semiconductor material such as, but not limited to, silicon. In some embodiments, substrate 102 can include a crystalline silicon substrate (e.g., wafer). In some embodiments, substrate 102 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

STI regions 106 can be configured to provide electrical isolation between finFETs 104A and 104B from each other and from neighboring finFETs with different fin structures (not shown) on substrate 102 and/or neighboring active and passive elements (not shown) integrated with or deposited on substrate 102. STI regions 106 can be made of a dielectric material. In some embodiments, STI regions 106 can include silicon oxide, silicon nitride, silicon oxynitride, fluorine-doped silicate glass (FSG), a low-k dielectric material, and/or other suitable insulating materials. In some embodiments, STI regions 106 can include a multi-layered structure, for example, a first and a second protective liners and an insulating layer disposed on the second protective liner (not shown). The first and second protective liners can include materials different from each other. Each of the first and second protective liners can include an oxide or nitride material. In some embodiments, the first protective liner can include a nitride material and the second protective liner can include an oxide material and can prevent oxidation of fin sidewalls during the formation of the insulating layer. In some embodiments, the first and second protective liners each can have a thickness ranging from about 1 nm to about 2 nm. In some embodiments, STI regions 106 can have a vertical dimension (e.g., height) 106H along a Z-axis ranging from about 40 nm to about 60 nm.

Fin structures 108A of NFET 104A and 108B of PFET 104B can extend along an X-axis and through gate structures 110. Fin structures 108A and 108B can include fin base regions 112A and 112B, and epitaxial fin regions 114A and 114B disposed on fin base regions 112A and 112B, respectively. Portions of fin base regions 112A and 112B extending above STI regions 106 can be wrapped around by gate structures 110 (not shown). In some embodiments, fin base regions 112A and 112B can include material similar to substrate 102. In some embodiments, fin base regions 112A and 112B can be formed from a photolithographic patterning and an etching of substrate 102. Based on the disclosure herein, it will be recognized that other materials and formation processes for fin base regions 112A and 112B are within the scope and spirit of this disclosure.

In some embodiments, epitaxial fin regions 114A and 114B can be grown on portions of respective fin base regions 112A and 112B that are not underlying gate structures 110, as illustrated in FIG. 1. Epitaxial fin regions 114A and 114B can include first epitaxial fin sub-regions 116A and 116B, and second epitaxial fin sub-regions 118A and 118B, respectively. In some embodiments, epitaxial fin regions 114A and 114B can have any geometric shape, for example, polygonal, elliptical, or circular. In some embodiments, epitaxial fin regions 114A and 114B on different fin base regions 112A and 112B can merge with adjacent epitaxial fin regions, respectively, as shown in FIG. 1. In some embodiments, epitaxial fin regions 114A and 114B can be unmerged (not shown) from adjacent epitaxial fin regions on separate fin base regions 112A and 112B, respectively.

Epitaxial fin regions 114A and 114B can include an epitaxially-grown semiconductor material. In some embodiments, the epitaxially grown semiconductor material is the same material as the material of substrate 102. In some embodiments, the epitaxially-grown semiconductor material can include a different material from the material of substrate 102. The epitaxially-grown semiconductor material can include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide.

In some embodiments, epitaxial fin regions 114A and 114B can be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 114A and 114B can be grown by an epitaxial deposition/partial etch process, which repeats the epitaxial deposition/partial etch process at least once. Such repeated deposition/partial etch process is also called a "cyclic deposition-etch (CDE) process." In some embodiments, epitaxial fin regions 114A and 114B can be grown by selective epitaxial growth (SEG), where an etching gas is added to promote the selective growth of semiconductor material on the exposed surfaces of fin base regions 112A and 112B, but not on insulating material (e.g., dielectric material of STI regions 106).

In some embodiments, epitaxial fin regions 114A can be n-type for NFET 104A (also referred to as n-type epitaxial fin regions 114A) and epitaxial fin regions 114B can be p-type for PFET 104B (also referred to as p-type epitaxial fin regions 114B).

In some embodiments, n-type epitaxial fin regions 114A can include Si and can be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used.

In some embodiments, n-type epitaxial fin regions 114A can have a plurality of n-type epitaxial fin sub-regions that can differ from each other based on, for example, doping concentration, and/or epitaxial growth process conditions. Referring to FIGS. 1 and 2A-2D, n-type epitaxial fin regions 114A can include first epitaxial fin sub-regions 116A and second epitaxial fin sub-regions 118A. In some embodiments, first epitaxial fin sub-regions 116A can have a vertical dimension (e.g., thickness) 116At along a Z-axis ranging from about 2 nm to about 20 nm. In some embodiments, second epitaxial fin sub-regions 118A can have a vertical dimension (e.g., thickness) 118At along a Z-axis ranging from about 3 nm to about 30 nm. A ratio between dimensions 118At and 116At can range from about 7 to about 15.

First and second epitaxial fin sub-regions 116A and 118A can have varying n-type dopant concentration with respect to each other, according to some embodiments. For example, first epitaxial fin sub-regions 116A can have a phosphorus dopant with a concentration ranging from about $2 \times 10^{20}$ atoms/cm$^3$ to about $5 \times 10^{20}$ atoms/cm$^3$. Second epitaxial fin sub-regions 118A can have a phosphorus dopant with a concentration ranging from about $2 \times 10^{21}$ atoms/cm$^3$ to about $5 \times 10^{21}$ atoms/cm$^3$. A ratio of the dopant concentrations between second epitaxial fin sub-regions 118A and first epitaxial fin sub-regions 116A can range from about 4 to about 25.

In some embodiments, p-type epitaxial fin regions 114B can include SiGe and can be in-situ doped during an epitaxial growth process using p-type dopants such as, boron, indium, or gallium. For p-type in-situ doping, p-type doping precursors such as, but not limited to, diborane ($B_2H_6$), boron trifluoride ($BF_3$), and/or other p-type doping precursors can be used.

In some embodiments, p-type epitaxial fin regions 114B can have a plurality of sub-regions that can include SiGe and can differ from each other based on, for example, doping concentration, epitaxial growth process conditions, and/or relative concentration of Ge with respect to Si. For example, referring to FIGS. 1 and 2A-2D, p-type epitaxial fin regions 114B can include first epitaxial fin sub-regions 116B and second epitaxial fin sub-regions 118B. In some embodiments, first epitaxial fin sub-regions 116B can have a vertical dimension (e.g., thickness) 116Bt along a Z-axis ranging from about 2 nm to about 20 nm. In some embodiments, second epitaxial fin sub-regions 118B can have a vertical dimension (e.g., thickness) 118Bt along a Z-axis ranging from about 3 nm to about 30 nm. A ratio between dimension 118Bt and dimension 116Bt can range from about 7 to about 15.

In some embodiments, the atomic percent Ge in first epitaxial fin sub-regions 116B can be smaller than the atomic percent Ge in second epitaxial fin sub-regions 118B. In some embodiments, first epitaxial fin sub-regions 116B can include Ge in a range from about 5 atomic percent to about 45 atomic percent, while second epitaxial fin sub-regions 118B can include Ge in a range from about 50 atomic percent to about 100 atomic percent with any remaining atomic percent being Si in the sub-regions.

First and second epitaxial fin sub-regions 116B and 118B can be epitaxially grown under a pressure of about 10 Torr to about 300 Torr and at a temperature of about 500° C. to about 700° C. using reaction gases such as HCl as an etching agent, GeH$_4$ as Ge precursor, dichlorosilane (DCS) and/or SiH$_4$ as Si precursor, B$_2$H$_6$ as B dopant precursor, H$_2$, and/or N$_2$. To achieve different concentration of Ge in the sub-regions, the ratio of a flow rate of Ge to Si precursors can be varied during their respective growth process, according to some embodiments. For example, a Ge to Si precursor flow rate ratio less than about 6 can be used during the epitaxial growth of first epitaxial fin sub-regions 116B, while a Ge to Si precursor flow rate ratio in a range from about 9 to about 25 can be used during the epitaxial growth of second epitaxial fin sub-regions 118B.

First and second epitaxial fin sub-regions 116B and 118B can have varying p-type dopant concentration with respect to each other, according to some embodiments. For example, first epitaxial fin sub-regions 116B can have a boron dopant with a concentration ranging from about $2 \times 10^{20}$ atoms/cm$^3$ to about $5 \times 10^{20}$ atoms/cm$^3$. Second epitaxial fin sub-regions 118B can have a boron dopant with a concentration ranging from about $1 \times 10^{21}$ atoms/cm$^3$ to about $2 \times 10^{21}$ atoms/cm$^3$. A ratio of the dopant concentrations between second epitaxial fin sub-regions 118B and first epitaxial fin sub-regions 116B can range from about 2 to about 10.

Based on the disclosure herein, it will be recognized that other materials, thicknesses, Ge concentrations, and dopant concentrations for n-type and/or p-type first and second epitaxial fin sub-regions are within the scope and spirit of this disclosure. First epitaxial fin sub-regions 116A and 116B can serve as buffers between fin base regions 112A and second epitaxial fin sub-regions 118A, and between fin base regions 112B and second epitaxial fin sub-regions 118B, respectively, to reduce leakage current during off-stage of finFETs 104A and 104B.

Referring to FIGS. 1 and 2A-2D, fin structures 108A and 108B can be current-carrying structures for respective fin-FETs 104A and 104B. Epitaxial fin regions 114A and 114B can be configured to function as source/drain (S/D) regions of respective finFETs 104A and 104B. Channel regions (not shown) of finFETs 104A and 104B can be formed in portions of their respective fin base regions 112A and 112B underlying gate structures 110.

Gate structures 110 can include a gate dielectric layer 122 and a gate electrode 124. Additionally, in some embodiments, another interfacial dielectric layer (not shown) can be formed between gate structures 110 and fin base regions 112A and 112B. Gate structures 110 can have a horizontal dimension (e.g., gate length) Lg along an X-axis ranging from about 5 nm to about 30 nm, according to some embodiments. Gate structures 110 can be formed by a gate replacement process.

In some embodiments, gate dielectric layer 122 is adjacent to and in contact with gate electrode 124. Gate dielectric layer 122 can have a horizontal dimension (e.g., thickness) 122t along an X-axis ranging from about 1 nm to about 5 nm. Gate dielectric layer 122 can include silicon oxide and can be formed by CVD, atomic layer deposition (ALD), physical vapor deposition (PVD), e-beam evaporation, or other suitable process. In some embodiments, gate dielectric layer 122 can include (i) a layer of silicon oxide, silicon nitride, and/or silicon oxynitride, (ii) a high-k dielectric material such as, for example, hafnium oxide (HfO$_2$), titanium oxide (TiO$_2$), hafnium zirconium oxide (HfZrO), tantalum oxide (Ta$_2$O$_3$), hafnium silicate (HfSiO$_4$), zirconium oxide (ZrO$_2$), zirconium silicate (ZrSiO$_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, gate dielectric layer 122 can include a single layer or a stack of insulating material layers. Based on the disclosure herein, it will be recognized that other materials and formation methods for gate dielectric layer 122 are within the scope and spirit of this disclosure.

Gate electrode 124 can include a gate barrier layer (not shown), a gate work function metal layer (not shown) and a gate metal fill layer (not shown). In some embodiments, the gate barrier layer is disposed on gate dielectric layer 122. Gate barrier layers can serve as nucleation layers for subsequent formation of gate work function layers and/or can help to prevent substantial diffusion of metals (e.g., Al) from gate work function layers to underlying layers (e.g. gate dielectric layer 122). Gate barrier layers can include titanium (Ti), tantalum (Ta), titanium nitride (TiN), tantalum nitride (TaN), or other suitable diffusion barrier materials and can be formed by ALD, PVD, CVD, or other suitable metal deposition processes. In some embodiments, gate barrier layers can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules. In some embodiments, gate barrier layers can have a thickness ranging from about 1 nm to about 10 nm. Other materials, formation methods and thicknesses for gate barrier layers are within the scope and spirit of this disclosure.

In some embodiments, the gate work function metal layer can include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer can be formed using a suitable process such as ALD, CVD, PVD, plating, or combinations thereof. In some embodiments, the gate work function metal layer has a thickness in a range from about 2 nm to about 15 nm. Based on the disclosure herein, it will be recognized that other materials, formation methods, and thicknesses for the gate work function metal layer are within the scope and spirit of this disclosure.

The gate metal fill layer can include a single metal layer or a stack of metal layers. The stack of metal layers can include metals different from each other. In some embodiments, the gate metal fill layer can include a suitable conductive material such as, for example, Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layer can be formed by ALD, PVD, CVD, or other suitable deposition process. Based on the disclosure herein, it will be recognized that other materials and formation methods for the gate metal fill layer are within the scope and spirit of this disclosure.

Gate spacers 120G can be formed on sidewalls of gate structures 110 and can be in contact with gate dielectric layer 122. Gate spacers 120G can include insulating material such as, for example, silicon oxide, silicon nitride, a low-k material, or a combination thereof. Gate spacers 120G can have a low-k material with a dielectric constant less than 3.9 (e.g., less than 3.5, 3, or 2.8). In some embodiments, each of gate spacers 120G can have a horizontal dimension (e.g., thickness) 120Gt ranging from about 3 nm to about 10 nm. Based on the disclosure herein, it will be recognized that other materials and dimensions for gate spacers 120G are within the scope and spirit of this disclosure.

Referring to FIG. 1, semiconductor device 100 can further include fin sidewall spacers 120F, gate capping structures 134, etch stop layer (ESL) 126, interlayer dielectric (ILD) 136, and S/D contact structures 132A and 132B of respective finFETs 104A and 104B, according to some embodiments.

Fin sidewall spacers 120F can be formed on sidewalls of first epitaxial fin sub-regions 116A and 116B, and can be in contact with STI regions 106. Fin sidewall spacers 120F can include insulating material similar to gate spacers 120G. In some embodiments, fin sidewall spacers 120F can affect the growth profile of first epitaxial fin sub-regions 116A and 116B. Based on the disclosure herein, it will be recognized that other materials for Fin sidewall spacers 120F are within the scope and spirit of this disclosure.

Gate capping structures 134 can be disposed on gate structures 110 and can be configured to protect the underlying structures and/or layers during subsequent processing of semiconductor device 100. For example, gate capping structures 134 can be configured to act as an etch stop layer during the formation of S/D contact structures 132A and 132B. In some embodiments, the thickness of gate capping structures 134 can range from about 10 nm to about 70 nm. Gate capping structures 134 can include one or more layers of insulating material having (i) nitride-based material such as, for example, silicon nitride, silicon-rich nitride, silicon oxynitride, titanium nitride; (ii) carbide-based material such as, for example, silicon carbide, titanium carbide, tungsten carbide, other suitable metal carbides; (iii) an elementary semiconductor such as, for example, silicon; (iv) metal oxide-based material; or (v) a combination thereof. In some embodiments, gate capping structures 134 can include a stack of layers of insulating material, where each layer of the stack can have a material and dimensions different from each other layers in the stack. The stack of layers can include two or more layers of the insulating material. Based on the disclosure herein, a person of ordinary skill in the art will recognize that other materials and thicknesses for gate capping structure 134 are within the scope and spirit of this disclosure.

ESL 126 can be configured to protect gate structures 110 and/or portions of epitaxial fin regions 114A and 114B that are not in contact with S/D contact structures 132A and 132B. This protection can be provided, for example, during formation of ILD layer 136 and/or S/D contact structures 132A and 132B. ESL 126 can be disposed on sides of gate spacers 120G. In some embodiments, ESL 126 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 126 can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 126 can have a thickness in a range from about 3 nm to about 30 nm. Based on the disclosure herein, it will be recognized that other materials, formation methods, and thicknesses for ESL 126 are within the scope and spirit of this disclosure.

ILD layer 136 can be disposed on ESL 126 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material is silicon oxide. In some embodiments, ILD layer 136 can have a vertical dimension (e.g., thickness) 136t ranging from about 50 nm to about 200 nm. Based on the disclosure herein, it will be recognized that other materials, thicknesses, and formation methods for ILD layer 136 are within the scope and spirit of this disclosure.

S/D contact structures 132A and 132B (also referred to as dual silicide contact structures) can be configured to electrically connect respective S/D regions (e.g., epitaxial fin regions 114A and 114B) of finFETs 104A and 104B to other elements of semiconductor device 100 and/or of the integrated circuit. S/D contact structures 132A and 132B can be formed within ILD layer 136. According to some embodiments, S/D contact structures 132A-132B of NFET 104A and PFET 103B can include metal silicide layers 128A-128B and conductive regions 130A-130B disposed on metal silicide layers 128A-128B, respectively.

In some embodiments, metal silicide layers 128A can include metal silicides formed from one or more low work function metals deposited on n-type epitaxial fin regions 114A. Low work function metal-based metal silicide layers 128A can lower the Schottky barrier height (SBH) between S/D contact structures 132A and S/D regions (e.g., epitaxial fin regions 114A) of NFET 104A, thus, lowering the contact resistance between S/D contact structures 132A and S/D regions of NFET 104A. Examples of low work function metal(s) used for forming metal silicide layers 128A can include Ti, Ta, Er, Y, Yb, Eu, Tb, Lu, Th, Sc, Hf, Zr, and/or other suitable low work function metal(s). Deposition of low work function metal(s) can include CVD, ALD, PECVD, plasma enhanced atomic layer deposition (PEALD), and/or other suitable deposition methods. In some embodiments, metal silicide layers 128A can have a thickness 128At ranging from about 2 nm to about 6 nm.

In some embodiments, metal silicide layers 128B can include metal silicides formed from one or more high work function metals deposited on p-type epitaxial fin regions 114B. High work function metal-based metal silicide layers 128B can lower the Schottky barrier height (SBH) between S/D contact structures 132B and S/D regions (e.g., epitaxial fin regions 114B) of PFET 104B, thus, lowering the contact resistance between S/D contact structures 132B and S/D regions of PFET 104B. Examples of high work function metal(s) used for forming metal silicide layers 128B can include Ru, Co, Ni, Ir, Rh, and/or other suitable high work function metal(s). Deposition of high work function metal(s) can include CVD, ALD, PECVD, plasma enhanced atomic layer deposition (PEALD), and/or other suitable deposition methods. In some embodiments, metal silicide layers 128B can have a thickness 128Bt ranging from about 2 nm to about 6 nm. Thus, NFET 104A and PFET 104B of the same semiconductor device 100 can have metal silicide layers 128A-128B selectively formed from different work function metal(s) that can be suitable to achieve low SBH and thus, low S/D contact resistance for both NFET 104A and PFET 104B without a trade-off between the SBHs of NFET 104A and PFET 104B.

In some embodiments, S/D contact structures 132A of NFET 104A can optionally include metal capping layers 131A (shown in FIGS. 1 and 2C) formed between metal silicide layers 128A and conductive region 130A of NFET 104A. Metal capping layers 131A can be configured as diffusion barriers to prevent oxidation of metal silicide layers 128A and diffusion of other unwanted atoms and/or ions into metal silicide layers 128A of NFET 104A during formation of conductive regions 130A. In some embodiments, metal capping layers 131A can include a single layer or a stack of conductive materials such as, for example, TiN, Ti, Ni, TiSiN, TaN, Ta, or a combination thereof. In some embodiments, metal capping layers 131A can act as an adhesion-promoting-layer, a glue-layer, a primer-layer, a protective-layer, and/or a nucleation-layer. Metal capping layers 131A can have a thickness in a range from about 1 nm to about 3 nm, according to some embodiments.

In some embodiments, conductive regions 130A and 130B can one or more include high work function metals, such as Ru, Co, Ni, Ir, Rh, and/or other suitable high work function metal. The high work function metal can be deposited on metal silicide layers 128A of NFET 104A and on p-type epitaxial fin regions 114B of PFET 104B without a conductive liner or barrier layer deposited by CVD, ALD, and/or other suitable deposition methods. In some embodiments, conductive regions 130A and 130B can have vertical dimensions (e.g., height) 130At and 130Bt along a Z-axis ranging from about 30 nm to about 50 nm. In some embodiments, 130At and 130Bt can be different from each other. According to some embodiments, PFET 104B can have conductive regions 130B of the one or more high work function metals disposed on p-type epitaxial fin regions 114B without metal silicide layers 128B between them and the one or more high work function metals can provide low SBH and low S/D contact resistance between conductive regions 130B and p-type epitaxial fin regions 114B.

Based on the disclosure herein, it will be recognized that other materials and dimensions for conductive liners, silicide layers 128A-128B, conducive regions 130A-130B are within the scope and spirit of this disclosure.

Though FIGS. 1 and 2A-2D show two gate structures 110, semiconductor device 100 can have fewer or additional gate structures similar and parallel to gate structures 110. Also, though FIGS. 1 and 2A-2D show two fin base portions 112A for NFET 104A and 112B for PFET 104B respectively, semiconductor device 100 can have fewer or additional fin base portions similar and parallel to fin base portions 112A and 112B. In addition, semiconductor device 100 can be incorporated into an integrated circuit through the use of other structural components such as gate contact structures, conductive vias, conductive lines, dielectric layers, passivation layers, etc., that are not shown for the sake of clarity. The cross-sectional shapes of STI regions 106, epitaxial fin regions 114A-114B, gate structures 110, gate spacers 120G, fin sidewall spacers 120F, S/D contact structures 132A-132B, and fin structures 108A and 108B are illustrative and are not intended to be limiting.

Figure 3:
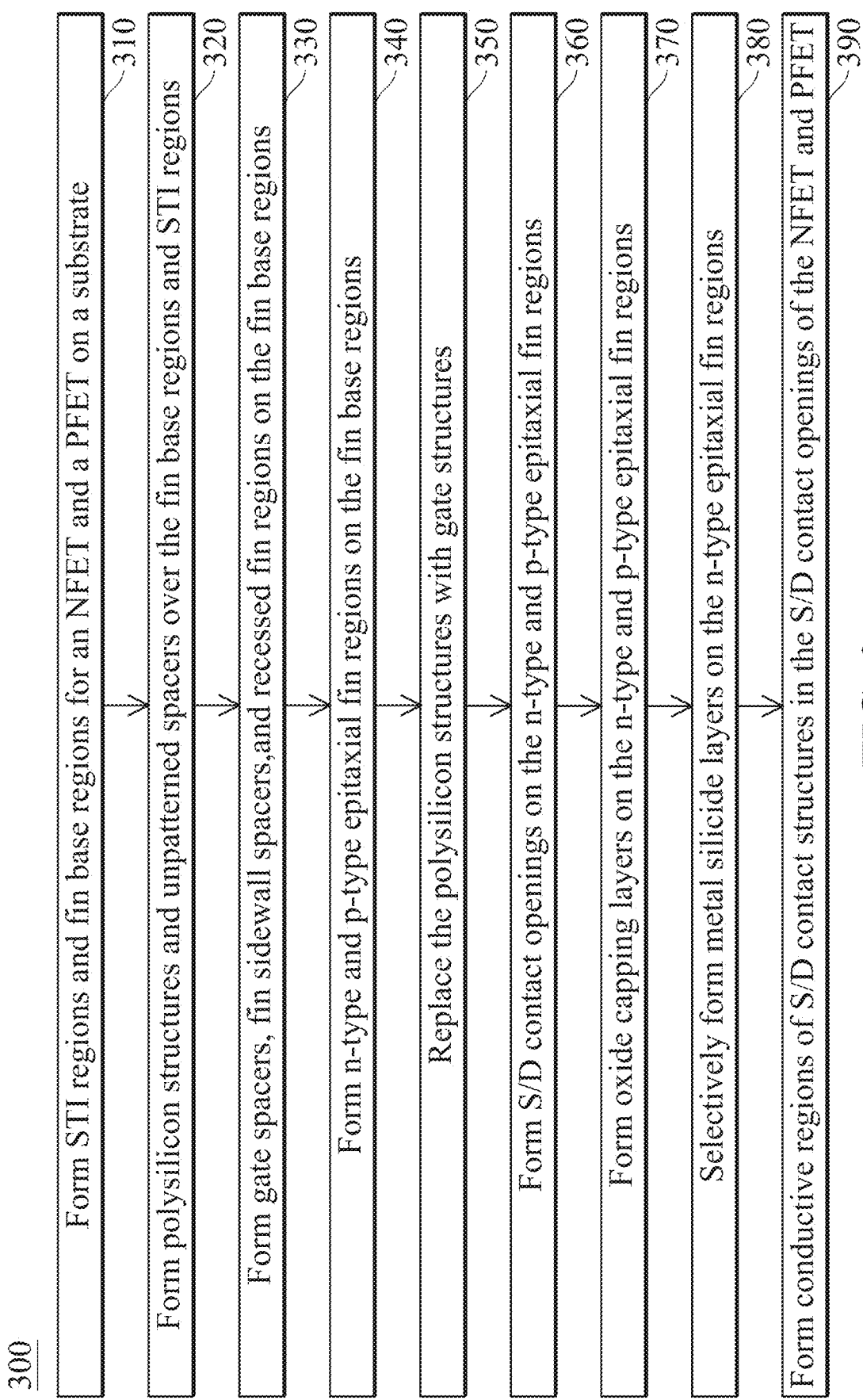
FIG. 3 is a flow diagram of a method for fabricating a semiconductor device with dual silicide contact structures, in accordance with some embodiments.
Figure 5:
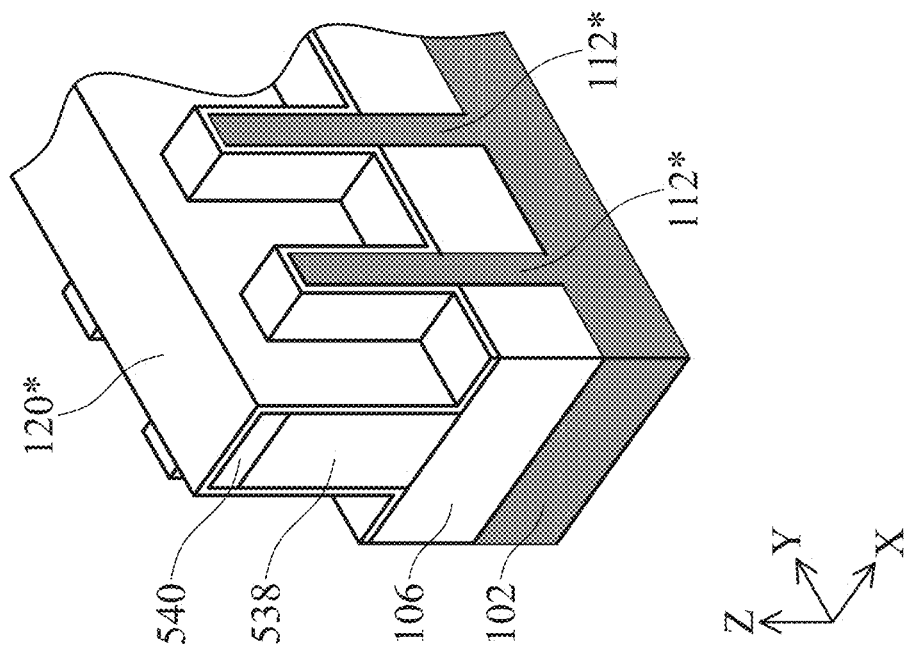
FIGS. 4-6 are isometric views of a semiconductor device with dual silicide contact structures at various stages of its fabrication process, in accordance with some embodiments.
Figure 4:
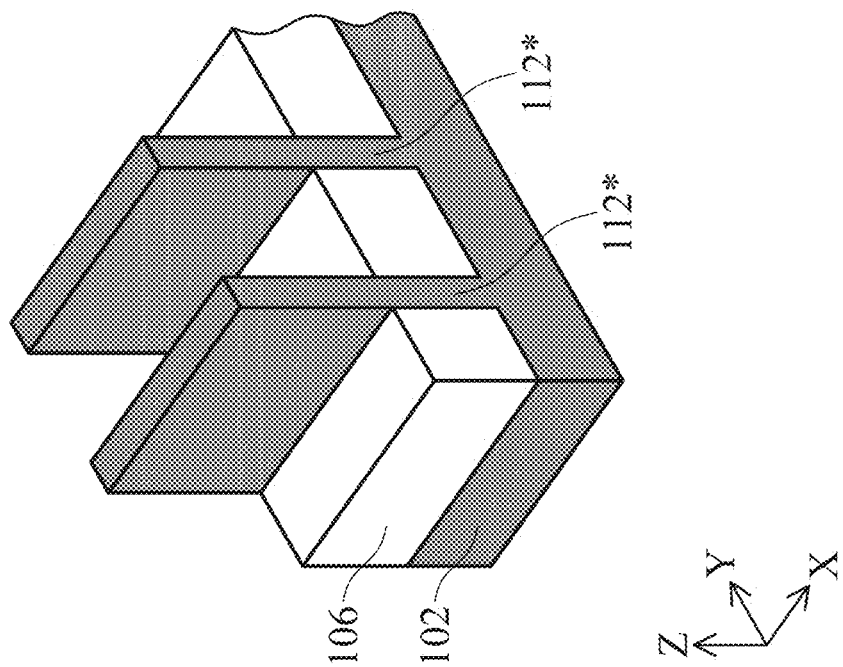
Figure 7:
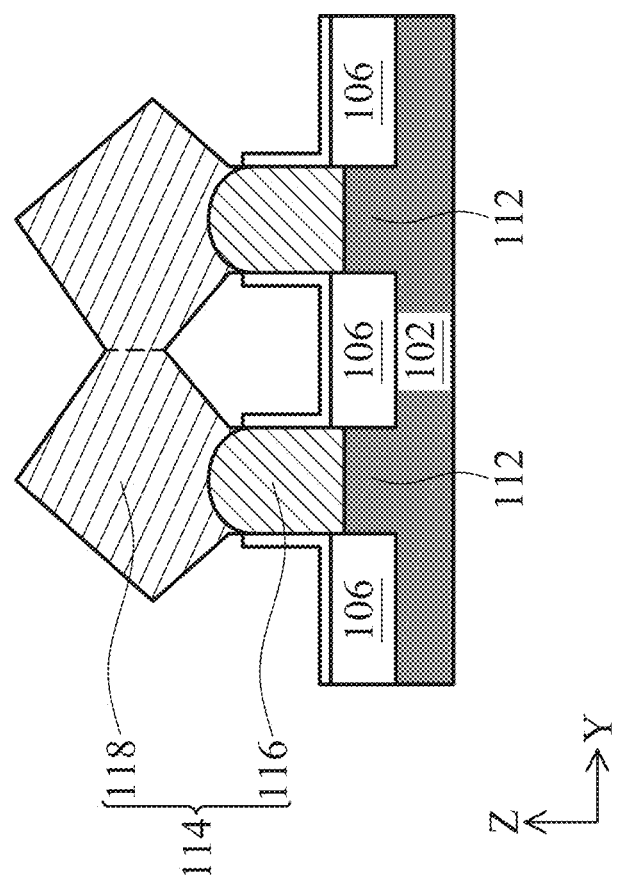
Figure 6:
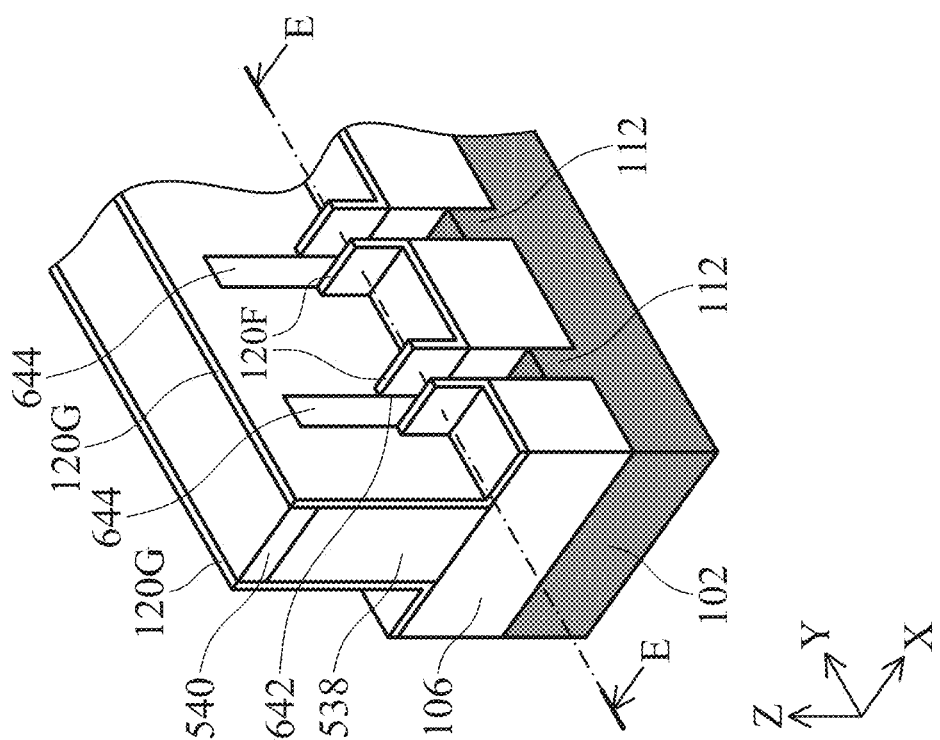

FIG. 3 is a flow diagram of an example method 300 for fabricating semiconductor device 100, according to some embodiments. For illustrative purposes, the operations illustrated in FIG. 3 will be described with reference to the example fabrication process for fabricating semiconductor device 100 as illustrated in FIGS. 4-7 and 8A-13D. FIGS. 4-6 are isometric views of semiconductor device 100 at various stages of its fabrication, according to some embodiments. FIG. 7 is a cross-sectional view along line E-E of semiconductor device 100 of FIG. 6 at a stage of its fabrication, according to some embodiments. FIGS. 8A-13A, 8B-13B, 8C-13C, and 8D-13D are cross-sectional views along lines A-A, B-B, C-C, and D-D of semiconductor device 100 of FIG. 1, respectively, at various stages of its fabrication, according to some embodiments. Operations can be performed in a different order or not performed depending on specific applications. It should be noted that method 300 does not produce complete semiconductor device 100. Accordingly, it is understood that additional processes can be provided before, during, and after method 300, and that some other processes can be briefly described herein. Elements in FIGS. 4-7 and 8A-13D with the same annotations as elements in FIGS. 1 and 2A-2D are described above.

In operation 310, fin base regions of an NFET and a PFET and STI regions are formed on a substrate. For example, as shown in FIG. 4, fin base regions 112* and STI regions 106 are formed on substrate 102. For the sake of clarity, two fin base regions 112* are shown in FIG. 4 for either NFET 104A or PFET 104B. Fin base regions 112* can be formed by etching substrate 102 through a patterned hard mask formed on unetched substrate 102 (not shown). In some embodiments, the patterned hard mask layer can be a thin film including silicon oxide formed, for example, using a thermal oxidation process. In some embodiments, the patterned hard mask layer can be formed of silicon nitride using, for example, low pressure chemical vapor deposition (LPCVD) or plasma enhanced CVD (PECVD).

Forming STI regions can follow the formation of fin base regions on the substrate. For example, as shown in FIG. 4, STI regions 106 can be formed on substrate 102. STI regions 106 can be formed by etching back a layer of insulating material deposited on fin base regions 112*. The layer of insulating material can be blanket deposited on fin base regions 112* followed by a chemical mechanical polishing (CMP) process. The CMP process can remove the patterned hard mask layers and portions of the layer of insulating material to substantially coplanarize a top surface of the layer of insulating material with top surfaces of fin base regions 112*.

In some embodiments, the layer of insulating material can include, for example, silicon oxide, silicon nitride, silicon oxynitride, fluoride-doped silicate glass (FSG), or a low-k dielectric material. In some embodiments, the layer of insulating material can be deposited using a flowable chemical vapor deposition (FCVD) process, a high-density-plasma (HDP) CVD process, using silane ($SiH_4$) and oxygen ($O_2$) as reacting precursors. In some embodiments, the layer of insulating material can be formed using a sub-atmospheric CVD (SACVD) process or high aspect-ratio process (HARP), where process gases can include tetraethoxysilane (TEOS) and/or ozone ($O_3$). In some embodiments, the layer of insulating material can be formed using a spin-on-dielectric (SOD) such as, for example, hydrogen silsesquioxane (HSQ) or methyl silsesquioxane (MSQ).

The etch back of the layer of insulating material can be performed, for example, by a dry etch process, a wet etch process, or a combination thereof. In some embodiments, the dry etch process can include using a plasma dry etch with a gas mixture having octafluorocyclobutane ($C_4F$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the etch process can each range from about 10 sccm to about 100 sccm. In some embodiments, the etch process with ammonia ($NH_3$) and hydrofluoric acid (HF) can be performed at a pressure ranging from about 5 mTorr to about 100 mTorr and a high temperature ranging from about 50° C. to about 120° C.

Referring to FIG. 3, in operation 320, polysilicon structures and unpatterned spacers are formed over the fin base regions and STI regions. For example, as shown in FIG. 5, a polysilicon structure 538 and an unpatterned spacer 120* can be formed over fin base regions 112* and STI regions 106. For the sake of clarity, polysilicon structure 538 and an unpatterned spacer 120* are shown in FIG. 5 for either NFET 104A or PFET 104B. Polysilicon structure 538 can be formed on the structure of FIG. 4. In some embodiments, a vertical dimension (e.g., height) along a Z-axis of polysilicon structure 538 can be in a range from about 90 nm to about 200 nm. In some embodiments, polysilicon structure 538 and hard mask layer 540 can be replaced in a gate replacement process during subsequent processing to form gate structures 110 discussed above.

In some embodiments, polysilicon structure 538 can be formed by blanket deposition of polysilicon, followed by photolithography and etching of the deposited polysilicon. The deposition process can include chemical vapor deposition (CVD), physical vapor deposition (PVD), atomic layer deposition (ALD), other suitable deposition methods, or a combination thereof. Photolithography can include photoresist coating (e.g., spin-on coating), soft baking, mask aligning, exposure, post-exposure baking, developing the photoresist, rinsing, drying (e.g., hard baking), other suitable processes, or a combination thereof. Etching processes can include dry etching, wet etching, and/or other etching methods (e.g., reactive ion etching).

In some embodiments, a hard mask layer 540 can be patterned on polysilicon structure 538 to protect polysilicon structure 538 from subsequent processing steps. Hard mask layer 540 can include insulating material such as, for example, silicon nitride.

In some embodiments, the formation of hard mask layer 540 can be followed by the formation of unpatterned spacer 120*. Unpatterned spacer 120* can be blanket deposited on exposed surfaces of polysilicon structures 538 and hard mask layer 540. Unpatterned spacers 120* can also blanket top surfaces of STI regions 106 and surfaces of fin base regions 112* protruding over STI regions 106 that are not covered by polysilicon structures 538. Unpatterned spacer 120* can be blanket deposited by CVD, PVD, ALD, and/or other suitable techniques. In some embodiments, unpatterned spacer 120* can include (i) a dielectric material such as, for example, silicon oxide, silicon carbide, silicon nitride, silicon oxy-nitride, (ii) an oxide material, (iii) an nitride material, (iv) a low-k material, or (v) a combination thereof.

Referring to FIG. 3, in operation 330, gate spacers, fin sidewall spacers, and recessed fin regions are formed. For example, as shown in FIG. 6, unpatterned spacer 120* can be dry etched using, for example, reactive ion etching (RIE) to form spacers 120 having portions of gate spacers 120G and fin sidewall spacers 120F. In some embodiments, spacers 120 can have a thickness in a range from 5 nm to 15 nm. The portions of fin base regions 112* that are not covered by polysilicon structure 538 and gate spacers 120G can be recessed to form recessed fin regions 642 and fin base regions 112. The portions of fin base regions 112* underlying gate spacers 120G and polysilicon structure 538 can form interfaces 644 with gate spacers 120G and polysilicon structure 538. In some embodiments, a biased etching process can be performed to form recessed fin regions 642. The etching process can be performed under a pressure ranging from about 1 mTorr to about 1000 mTorr, a power ranging from about 50 W to about 1000 W, a bias voltage ranging from about 20 V to about 500 V, at a temperature ranging from about 40° C. to about 60° C., and using a HBr and/or $Cl_2$ as etch gases. During the etching process, top surface of polysilicon structure 538 can be protected from being etched by hard mask layer 540. In some embodiments, fin sidewall spacers 120F can affect epitaxial layer growth profile in recessed fin regions 642 during subsequent processing steps.

Referring to FIG. 3, in operation 340, n-type and p-type epitaxial fin regions are formed on fin base regions for the NFET and PFET. For example, FIG. 7 can be a cross-sectional view of the structure of FIG. 6 along line E-E after the formation of epitaxial regions 114 on either side of polysilicon structure 538 and on fin base regions 112. For the sake of clarity, epitaxial region 114 is shown in FIG. 7 for either NFET 104A or PFET 104B. The cross-sectional view of FIG. 7 may not be drawn in the same scale as the isometric view of FIG. 6 and FIG. 7 can be a cross-sectional view of NFET 104A or PFET 104B.

The formation of epitaxial fin regions 114 on fin base regions 112 can follow the etching of unpatterned spacer 120*. In some embodiments, epitaxial fin regions 114 can be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 114 can be grown by an epitaxial deposition/partial etch process, which repeats the epitaxial deposition/partial etch process at least once. Such repeated deposition/partial etch process is also called a "cyclic deposition-etch (CDE) process." In some embodiments, epitaxial fin regions 114 can be grown by selective epitaxial growth (SEG), where an etching gas is added to promote the selective growth of semiconductor material on the exposed surfaces of fin base regions 112, but not on insulating material (e.g., dielectric material of STI regions 106). In some embodiments, epitaxial regions 114 can be grown with in-situ doping.

In some embodiments, the formation of epitaxial fin regions 114 can include the formation of first epitaxial fin sub-regions 116 and second epitaxial fin sub-regions 118. In some embodiments, first epitaxial fin sub-regions 116 and second epitaxial fin sub-regions 118 can have different vertical dimension (e.g., thickness) along a Z-axis. In some embodiments, first epitaxial fin sub-regions 116 can have lower doping concentration than second epitaxial fin sub-regions 118. In some embodiments, epitaxial fin regions 114 can be p-type (e.g., epitaxial fin regions 114B) for PFET 104B and can include epitaxial SiGe, and first epitaxial fin sub-regions 116 can have lower Ge concentration than second epitaxial fin sub-regions 118. Though FIG. 7 shows adjacent second epitaxial fin sub-regions 118 are merged, in some embodiments, adjacent second epitaxial fin sub-regions 118 on adjacent first epitaxial fin sub-regions 116 can remain unmerged with each other (not shown).

In some embodiments, epitaxial fin regions 114 can be n-type for NFET 104A (e.g., epitaxial fin regions 114A) and can have (i) first epitaxial fin sub-regions 116 with a vertical dimension (e.g., thickness) along a Z-axis ranging from about 2 nm to about 20 nm and a phosphorus dopant concentration ranging from about $2\times10^{20}$ atoms/cm$^3$ to about $5\times10^{20}$ atoms/cm$^3$, and (ii) second epitaxial fin sub-regions 118 with a vertical dimension (e.g., thickness) along a Z-axis ranging from about 3 nm to about 30 nm and a phosphorus dopant concentration ranging from about $2\times10^{21}$ atoms/cm$^3$ to about $5\times10^{21}$ atoms/cm$^3$. In some embodiments, epitaxial fin regions 114 can be p-type for PFET 104B (e.g., epitaxial fin regions 114B) and can have (i) first epitaxial fin sub-regions 116 with a vertical dimension (e.g., thickness) along a Z-axis ranging from about 2 nm to about 20 nm and a boron dopant concentration ranging from about $2\times10^2$ atoms/cm$^3$ to about $5\times10^2$ atoms/cm$^3$, and (ii) second epitaxial fin sub-regions 118 with a vertical dimension (e.g., thickness) along a Z-axis ranging from about 3 nm to about 30 nm and a boron dopant concentration ranging from about $1\times10^{21}$ atoms/cm$^3$ to about $2\times10^{21}$ atoms/cm$^3$.

Figure 8C:
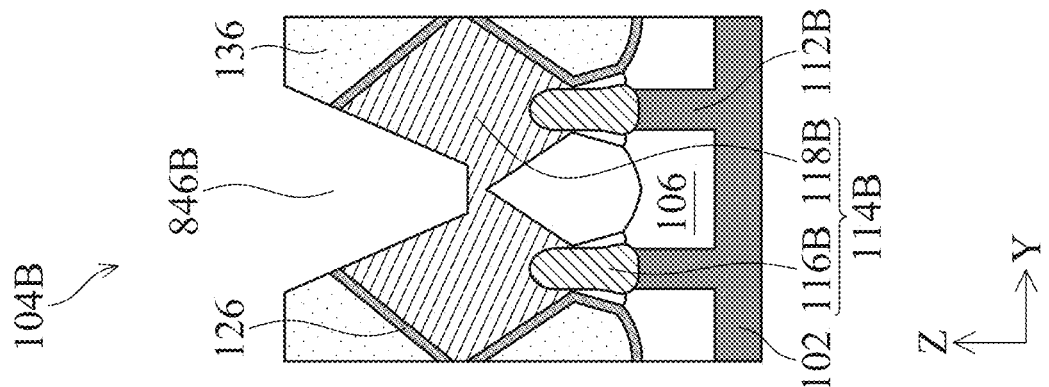

Referring to FIG. 3, in operation 350, the polysilicon structures can be replaced with gate structures. For example, as shown in FIGS. 8A-8B gate structures 110 of NFET 104A and PFET 104B can be formed simultaneously after removing polysilicon structures similar to polysilicon structure 538 (shown in FIG. 6). The structures of FIGS. 8A-8D can be formed on substrate 102 after the formation of epitaxial fin regions 114 (shown in FIG. 7) for NFET 104A (e.g., epitaxial fin regions 114A) and PFET 104B (e.g., epitaxial fin regions 114B) on structures similar to the structure of FIG. 6. The structures of FIGS. 4-6 can be formed simultaneously on substrate 102 for NFET 104A and PFET 104B. The formation of epitaxial fin regions 114 (shown in FIG. 7) for NFET 104A (e.g., epitaxial fin regions 114A) and PFET 104B (e.g., epitaxial fin regions 114B) can be formed sequentially. For example, epitaxial fin regions 114A can be formed before or after the formation of epitaxial fin regions 114B.

In some embodiments, prior to the removal of polysilicon structures 538 to form gate structures 110 as shown in FIGS. 8A-8B, ESL 126 and ILD layer 136 can be formed as shown in FIGS. 8A-8D. In some embodiments, ESL 126 can include, for example, SiNx, SiON, SiC, SiCN, BN, SiBN, SiCBN, or a combination thereof. In some embodiments, ESL 126 can include silicon nitride formed by LPCVD, PECVD, CVD, or ALD. In some embodiments, ILD layer 136 can include a dielectric material. The dielectric material of ILD layer 136 can be deposited using a deposition method suitable for flowable dielectric materials (e.g., flowable silicon oxide). For example, flowable silicon oxide can be deposited for ILD layer 136 using FCVD.

The removal of polysilicon structures 538 and hard mask layer 540 can be performed using a dry etching process (e.g., reaction ion etching) or a wet etching process. In some embodiments, the gas etchants used in etching of polysilicon structures 538 and hard mask layer 540 can include chlorine, fluorine, or bromine. In some embodiments, an $NH_4OH$ wet etch can be used to remove polysilicon structures 538, or a dry etch followed by a wet etch process can be used to remove polysilicon structures 538.

The formation of gate structures 110 can include deposition of gate dielectric layer 122. Gate dielectric layer 122 can include silicon oxide and can be formed by CVD, ALD, PVD, e-beam evaporation, or other suitable process. In some embodiments, gate dielectric layer 122 can include (i) a layer of silicon oxide, silicon nitride, and/or silicon oxynitride, (ii) a high-k dielectric material such as, for example, hafnium oxide ($Hf_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers can be formed by ALD and/or other suitable methods. In some embodiments, gate dielectric layer 122 can include a single layer or a stack of insulating material layers.

The deposition of gate dielectric layer 122 can be followed by deposition of gate electrode 124. Gate electrode 124 can include a single metal layer or a stack of metal layers. The stack of metal layers can include metals different from each other. In some embodiments, gate electrode 124 can include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate electrode 124 can be formed by ALD, PVD, CVD, or other suitable deposition process. In some embodiments, conductive material of gate electrode 124 for NFET 104A can be different from conductive material of gate electrode 124 for PFET 104B. The deposited gate dielectric layer 122 and gate electrode 124 can be planarized by a CMP process. The CMP process can coplanarize top surfaces of gate dielectric layer 122 and gate electrode 124 with a top surface of ILD layer 136 (not shown).

In some embodiments, portions of gate structure can be removed and a gate capping structure can be formed on the etched back gate structure. For example, as shown in FIGS. 8A and 8B, each of gate structures 110 can be etched back by a vertical dimension along a Z-axis from top surface of gate structures 110. In some embodiments, the vertical dimension can range from about 15 nm to about 80 nm for gate structures 110 having a vertical dimension along a Z-axis ranging from about 40 nm to about 200 nm prior to the etch back of gate structures 110. A ratio between the etched back portion and gate structures 110 can range from about 7% to about 40%. The etch back process can be performed by a dry etch process. The dry etch process can use a fluorine-based etchant. In some embodiments, the dry etch can be performed using a gas mixture including carbon tetrafluoride ($CF_4$), fluoromethane ($CH_3F$), and fluoroform ($CHF_3$). Oxygen and hydrogen gases can be included in the gas mixture for etch selectivity. The flow rate of the gas mixture can range from about 50 sccm to about 950 sccm. The ratio of $CH_3F$ to oxygen during the etch process can range from about 1:10 to about 10:1. The etch process can be carried out at a temperature ranging from about 10° C. to about 100° C., under a pressure ranging from about 10 mTorr to about 100 mTorr.

The etch back of gate structures 110 can be followed by the formation of gate capping structures 134. For example, gate capping structures 134 can be formed on ESL 126, gate spacers 120G, and gate structures 110. Gate capping structures 134 can include one or more layers of insulating material deposited, for example, using an ALD process. The one or more layers of insulating material can have (i) nitride-based material such as, for example, silicon nitride, silicon-rich nitride, silicon oxynitride, titanium nitride; (ii) carbide-based material such as, for example, silicon carbide, titanium carbide, tungsten carbide, other suitable metal carbides; (iii) an elementary semiconductor such as, for example, silicon; (iv) metal oxide-based material; or (v) a combination thereof. The deposition of insulating material(s) for gate capping structures 134 can be followed by a CMP process to coplanarize top surfaces of gate capping structures 134 with top surfaces of ESL 226 and gate spacers 120G.

Referring to FIG. 3, in operation 360, S/D contact openings are formed on the n-type and p-type epitaxial fin regions. For example, as shown in FIGS. 8A-8D, S/D contact openings 846A-846B can be formed simultaneously on respective n-type epitaxial fin regions 114A and p-type epitaxial fin regions 114B. The formation of S/D contact openings 846A-846B can include sequential steps of: (i) removing portions of ILD layer 136 overlying n-type epitaxial fin regions 114A and p-type epitaxial fin regions 114B and (ii) removing portions of ESL 126 underlying the etched portions of ILD layer 136. The removal of the portions of ILD layer 136 can include patterning using photolithography to expose areas on top surface of ILD layer 136 corresponding to the portions of ILD layer 136 that are to be removed. The portions of ILD layer 136 can be removed by a dry etching process. In some embodiments, the dry etching process can be a fluorine-based process.

The ILD etch process can include two steps. In the first etch step, etching can be performed using $CF_4$ gas at a flow rate ranging from about 50 sccm to about 500 sccm. In the second etch step, etching can be performed using a gas mixture including $C_4F_6$ gas at a flow rate ranging from about 5 sccm to about 50 sccm, Ar gas at a flow rate ranging from about 100 sccm to about 500 sccm, and $O_2$ gas at a flow rate ranging from about 5 sccm to about 50 sccm. In some embodiments, each of the first and second etch steps can be carried out for a time period ranging from about 1 sec to about 60 sec. In some embodiments, each of the first and second etch steps can be performed at a temperature ranging from about 10° C. to about 100° C., under a pressure ranging from about 3 mTorr to about 500 mTorr, and at an RF power ranging from about 300 W to about 800 W. In some embodiments, the first etch step has a higher etch rate than the second etch step.

Figure 8D:
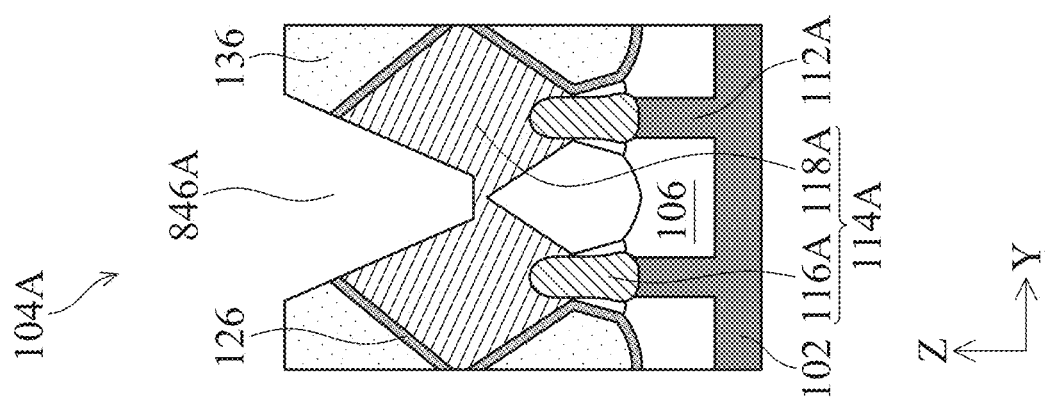

The etching of the portions of ILD layer 136 can be followed by a dry etching of portions of ESL 126 underlying the etched portions of ILD layer 136. In some embodiments, these portions of ESL 126 can be etched in two steps. In the first etch step, etching can be performed using a gas mixture including difluoromethane ($CH_2F_2$) gas at a flow rate ranging from about 5 sccm to about 50 sccm and carbon tetrafluoride ($CF_4$) gas at a flow rate ranging from about 10 sccm to about 100 sccm. In the second etch step, etching can be performed using a gas mixture including fluoromethane ($CH_3F$) gas at a flow rate ranging from about 5 sccm to about 50 sccm, Ar gas at a flow rate ranging from about 100 sccm to about 500 sccm, and $H_2$ gas at a flow rate ranging from about 100 sccm to about 500 sccm. In some embodiments, each of the first and second etch steps can be carried out for a time period ranging from about 1 sec to about 60 sec. In some embodiments, each of the first and second etch steps can be performed at a temperature ranging from about 10° C. to about 100° C., under a pressure ranging from about 10 mTorr to about 100 mTorr, and at an RF power ranging from about 500 W to about 800 W. In some embodiments, the first etch step has a higher etch rate than the second etch step. In some embodiments, a portion of epitaxial fin regions 114A and 114B can be etched and exposed during etching portions of ESL 126, as shown in FIGS. 8C-8D.

Referring to FIG. 3, in operation 370, oxide capping layers can be formed on the n-type and p-type epitaxial fin regions within the S/D contact openings. For example, as shown in FIGS. 9A-9D, oxide capping layers 948A-948B can be conformally and simultaneously formed on exposed surfaces of epitaxial fin regions 114A-114B within S/D contact openings 846A-846B, respectively. Oxide capping layers 948A-948B can be formed in an oxidation process using a mixture of $H_2O$ and $O_2$ at a temperature ranging from about 300° C. to about 600° C. The mixture can include a ratio of $H_2O:O_2$ ranging from about 5% to about 30%. The oxidation process can be performed for a time period ranging from about 5 min to about 120 min and under a pressure ranging from about 10 Torr to about 300 Torr. Other methods and process conditions for forming oxide capping layers 948A-948B on respective n-type and p-type epitaxial fin regions 114A-114B are within the scope and spirit of this disclosure.

According to some embodiments, oxide growth rates on n-type and p-type epitaxial fin regions of an NFET and a PFET, respectively, can be different from each other. For example, as shown in FIGS. 9A-9D, thicker oxide capping layers 948B can be formed on PFET 104B than oxide capping layers 948A formed on NFET 104A. In some embodiments, oxide capping layers 948A-984B formed in the same oxidation process on n-type epitaxial fin regions 114A and p-type epitaxial fin regions 114B can have vertical dimension (e.g., thickness) along a Z-axis ranging from about 1 nm to about 3 nm and from about 4 nm to about 12 nm, respectively. A ratio of oxide growth rates on p-type epitaxial fin regions 114B and n-type epitaxial fin regions 114A can range from about 3 to about 10 and a difference between the thicknesses of oxide capping layers 948A-948B can range from about 3 nm to about 10 nm. In some embodiments, a difference between the thickness of oxide capping layers 948A grown on phosphorus doped Si-containing epitaxial fin regions and the thickness of oxide capping layers 948B grown on boron doped SiGe-containing epitaxial fin regions 114B can be about 4 nm. The thicker oxide capping layers 948B can be due to the presence of Ge in p-type epitaxial fin regions 114B. In some embodiments, oxide capping layers 948A grown on epitaxial fin regions 114A having SiP can include $SiPO_x$ and oxide capping layers 948B grown on epitaxial fin regions 114B having SiGeB can include SiGeBO.

Referring to FIG. 3, in operation 380, metal silicide layers can be selectively formed on the n-type epitaxial fin regions of the NFET. For example, as shown in FIGS. 11A-11D, metal silicide layers 128A can be formed on epitaxial fin regions 114A of NFET 104A. The formation of metal silicide layers 128A can include sequential steps of: (i) cleaning of oxide capping layers 948A-948B to form the structures of FIGS. 10A-10D, (ii) selectively depositing a low work function metal layer on epitaxial fin regions 114A of FIGS. 10A and 10C, (iii) selectively depositing metal capping layers 131A on the selectively deposited low work function metal layer, and (iv) rapid thermal annealing (RTA) the selectively deposited layers on epitaxial fin regions 114A to form the structures of FIGS. 11A and 11C.

The cleaning of oxide capping layers 948A-948B can be performed by a dry etching process. In some embodiments, the dry etching process can be a fluorine-based process. In some embodiments, the dry etching process can be performed using a gas mixture including ammonia ($NH_3$) and nitrogen trifluoride ($NF_3$) at a temperature ranging from about 30° C. to about 200° C. The gas ratio of $NH_3$ to $NF_3$ in the gas mixture can range from about 1 to about 6. In some embodiments, the dry etching process can include a SiCoNi etch process, which includes using a remote plasma assisted dry etch process that involves the simultaneous exposure of oxide capping layers 948A-948B to $H_2$, $NF_3$, and $NH_3$ plasma by-products. In some embodiments, the cleaning process can include etching and removing residues on the surfaces of epitaxial fin regions 114A within S/D contact openings 846A. In some embodiments, the cleaning process can be a one-step etch.

Figure 10A:
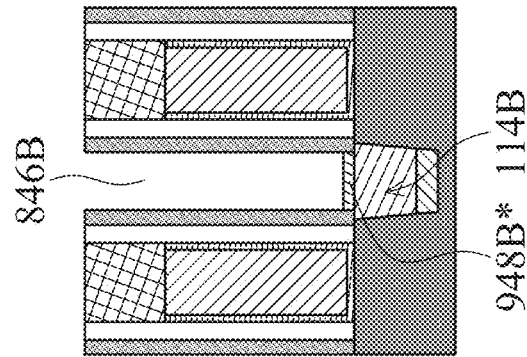
Figure 10B:
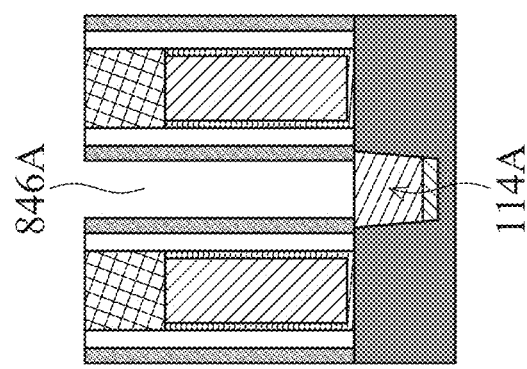
Figure 10D:
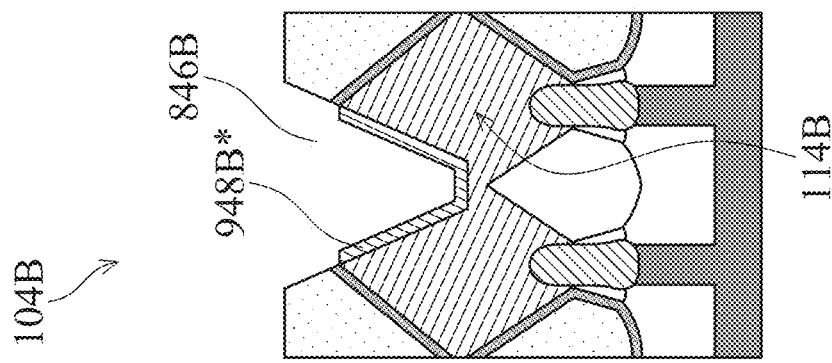
Figure 10C:
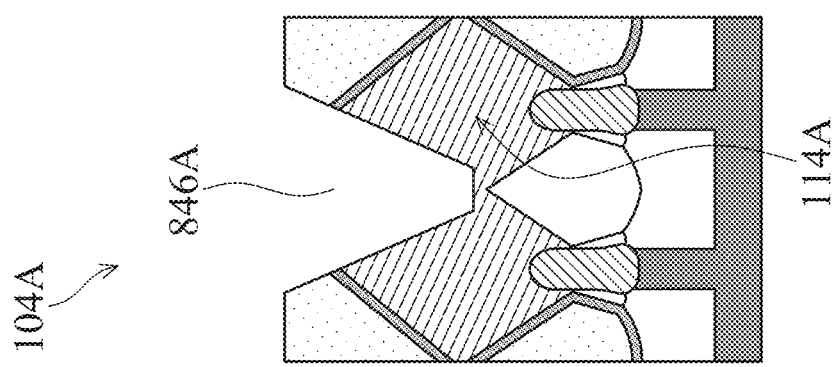
Figure 11B:
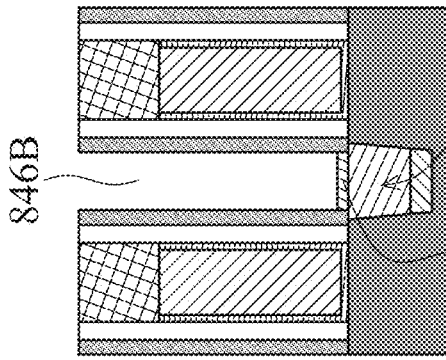
Figure 11A:
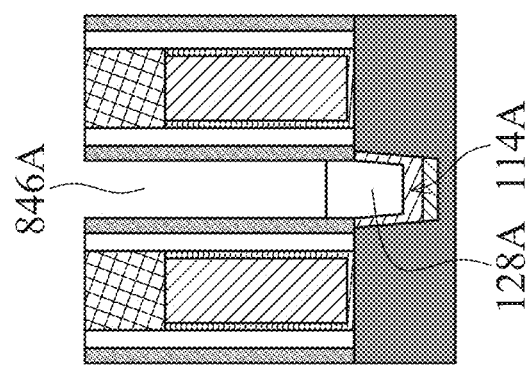
Figure 11D:
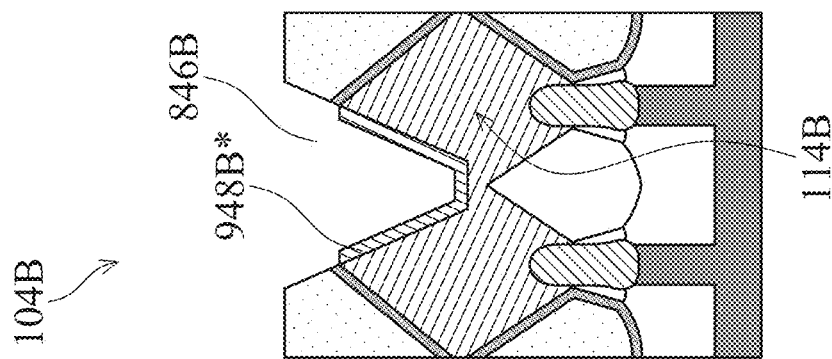
Figure 11C:
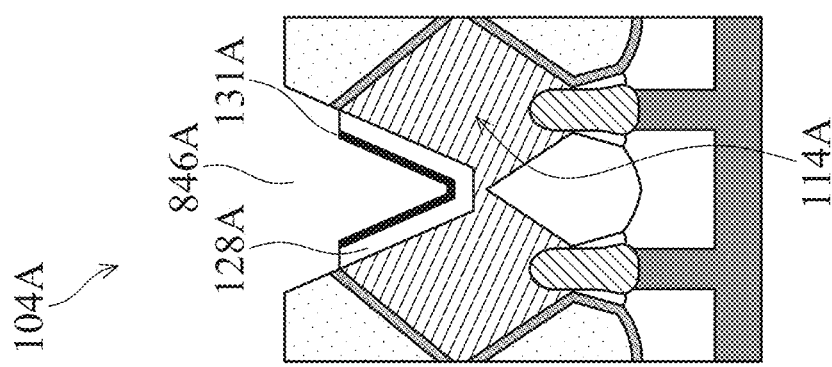

During the cleaning process, the etching rate of oxide capping layers 948A grown on n-type epitaxial fin regions 114A can be substantially the same as the etching rate of oxide capping layers 948B grown on p-type epitaxial fin regions 114B. As oxide capping layers 948A have a thickness smaller than the thickness of oxide capping layers 948B, oxide capping layers 948A can be completely removed during the cleaning process without a complete removal of oxide capping layers 948B as shown in FIGS. 10A-10D. After the cleaning process, oxide capping layers 948B can be modified to oxide capping layers 948B* with a smaller thickness (e.g., about 4 nm) than oxide capping layers 948B as shown in FIGS. 10B and 10D. Based on the disclosure herein, it will be recognized that other etching processes, etchants, etching rates, and dimensions of oxide layers after etching are within the scope and spirit of this disclosure.

According to some embodiments, the cleaning process can be performed for a time period long enough to completely remove oxide capping layers 948A on n-type epitaxial fin regions 114A while leaving a portion of oxide capping layers 948B on p-type epitaxial fin regions 114B. In some embodiments, the time period can depend on the thickness of oxide capping layers 948A and can range from about 10 seconds to about 200 seconds.

Figure 14:
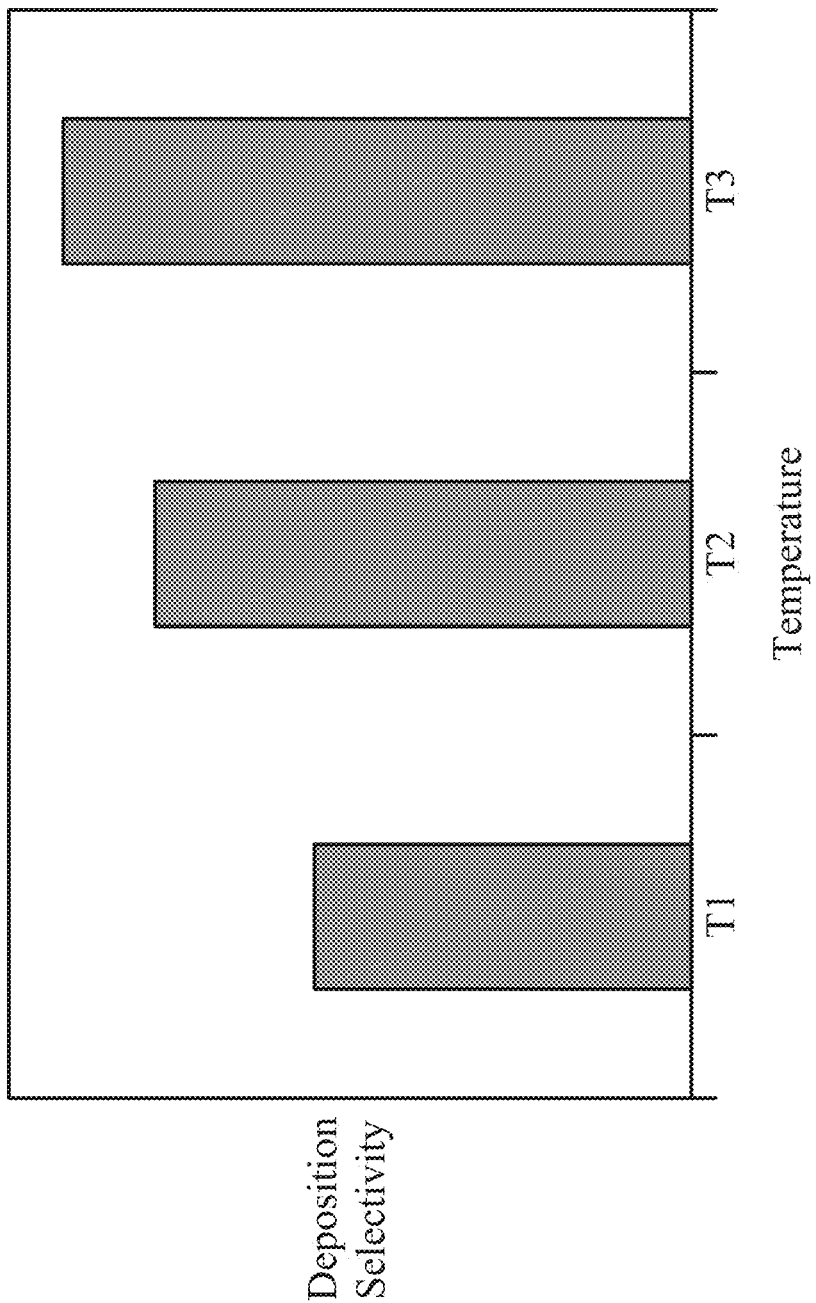
FIG. 14 illustrates a relationship between deposition selectivity and deposition temperature, in accordance with some embodiments.

The cleaning of oxide capping layers 948A and 984B can be followed by the selective deposition of the low work function metal layer on n-type epitaxial fin regions 114A of NFET 104A without any substantial deposition of the low work function metal layer on oxide capping layers 948B* of PFET 104B, according to some embodiments. The low work function metal layer can include one or more low work function metals, such as Ti, Ta, Er, Y, Yb, Eu, Tb, Lu, Th, Sc, Hf, Zr, and/or other suitable low work function metal. These low work function metals can be deposited by CVD, ALD, PECVD, PEALD, and/or other suitable deposition methods. The selective deposition of the low work function metal layer can be performed at a temperature ranging from about 380° C. to about 530° C. The low work function metal layer can have a deposition selectivity between Si and $SiO_2$ ranging from about 3 to about 20. This deposition selectivity between Si and $SiO_2$ can depend on the low work function metal layer deposition temperature. In some embodiments, the deposition selectivity can range from about 4 to about 8 for the deposition temperature ranging from about 400° C. to about 500° C. For example, the deposition selectivity can be about 4, 6, or 7 for a deposition temperature of about 400° C., about 450° C., or about 480° C., respectively. In some embodiments, the deposition selectivity can be dependent on the deposition temperature. For example, as shown in FIG. 14, the deposition selectivity can increase with the deposition temperatures increasing from T1 to T3, wherein temperature T1 is smaller than temperature T2 and temperature T2 is smaller than temperature T3. Based on the disclosure herein, it will be recognized that other low work function metal, deposition methods, deposition temperature, and deposition selectivity between Si and $SiO_2$ are within the scope and spirit of this disclosure.

In some embodiments, the selective deposition of the low work function metal layer can include pulse-RF PECVD with a mixture of $TiCl_x$ precursor and $H_2$. Ti metal can be deposited on n-type epitaxial fin regions 114A, a portion of the deposited Ti can react with Si of n-type epitaxial fin regions 114A to form TiSi, a portion of the deposited Ti can be etched through chemical reactions (1)-(3):

$$TiCl_x + H^* \rightarrow Ti + HCl. \quad (1)$$

$$TiCl_x + Si \rightarrow TiSi + SiCl_x. \quad (2)$$

$$Ti + TiCl_4 \rightarrow TiCl_x. \quad (3)$$

However, Ti metal deposited on oxide capping layers 948B* can be etched through chemical reactions (4)-(5), resulting in no deposition of Ti metal on oxide capping layers 948B* of PFET 2014B:

$$TiCl_x + H^* \rightarrow Ti + HCl. \quad (4)$$

$$Ti + TiCl_4 \rightarrow TiCl_x. \quad (5)$$

The selective deposition of the low work function metal layer can be followed by depositing metal capping layers 131A on the selectively deposited low work function metal layer. In some embodiments, metal capping layers 131A can be selectively deposited on the low work function metal layer and not on oxide capping layers 948B*. The metal capping layers 131A can be configured as diffusion barriers to prevent oxidation of the low work function metal layer and diffusion of other unwanted atoms and/or ions into the low work function metal layer during subsequent processes. In some embodiments, metal capping layers 131A can include a single layer or a stack of conductive materials such as, for example, TiN, Ti, Ni, TiSiN, TaN, Ta, or a combination thereof. In some embodiments, metal capping layers 131A can act as an adhesion-promoting-layer, a glue-layer, a primer-layer, a protective-layer, and/or a nucleation-layer. According to some embodiments, metal capping layers 131A can include TiSiN or TiN and have a thickness ranging from about 1 nm to about 3 nm. Based on the disclosure herein, it will be recognized that other conductive liner metal and thickness are within the scope and spirit of this disclosure.

The deposition of metal capping layers 131A can be followed by a rapid thermal annealing (RTA) process for a few seconds at a temperature ranging from about 450° C. to about 700° C. Portions of the low work function metal layer and metal capping layers 131A can react with n-type epitaxial fin regions 114A to form metal silicide layers 128A during selective deposition of the low work function metal layer and RTA process. In some embodiments, the low work function metal layer can include Ti and after the RTA process metal silicide layers 128A having TiSi can be formed. In some embodiments, metal silicide layers 128A can have a vertical dimension (e.g., thickness) 128At along a Z-axis ranging from about 2 nm to about 6 nm. Based on the disclosure herein, it will be recognized that other annealing methods, annealing temperatures, and silicide layer dimensions are within the scope and spirit of this disclosure.

Figure 12B:
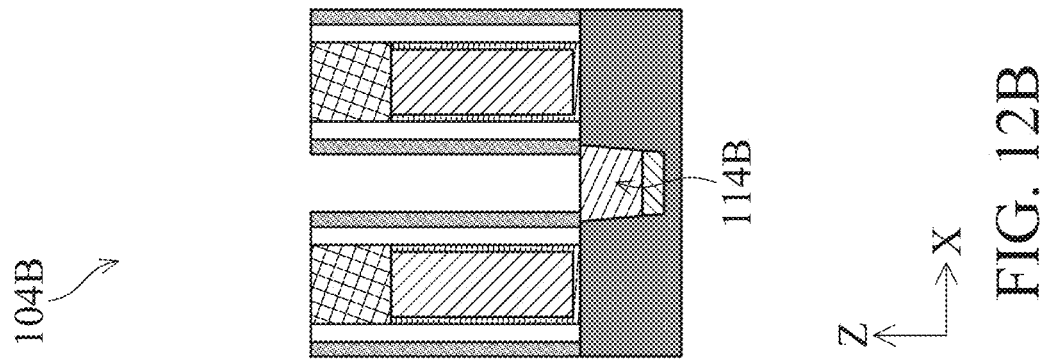
Figure 12A:
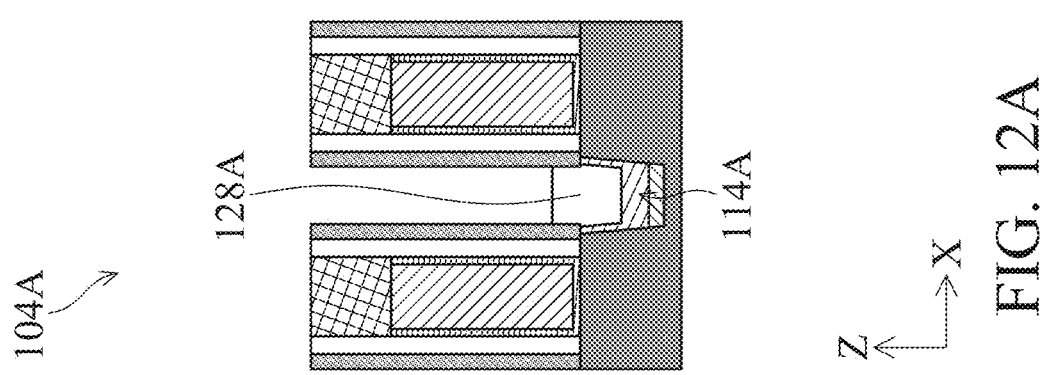
Figure 12C:
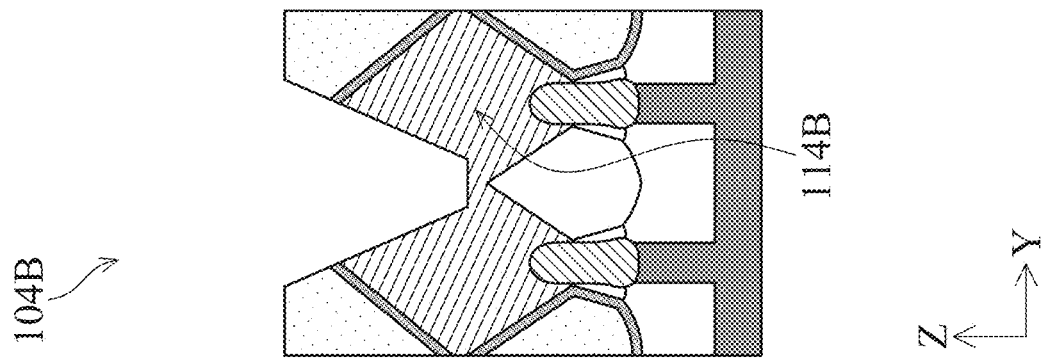
Figure 12D:
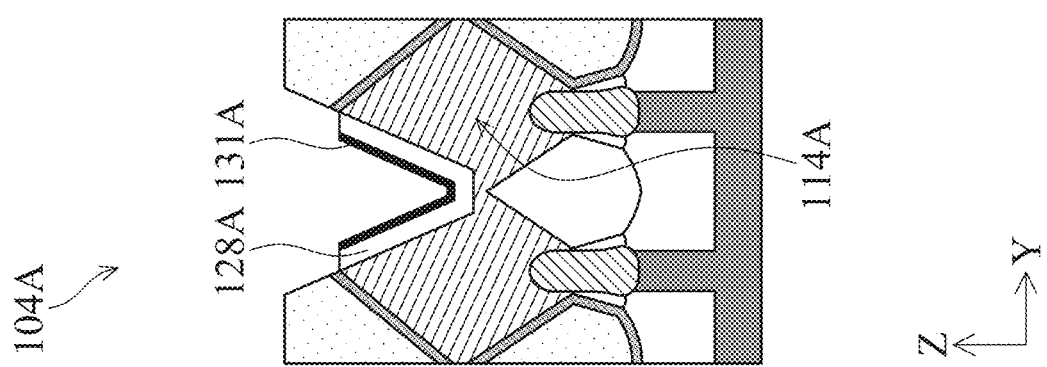
Figure 13C:
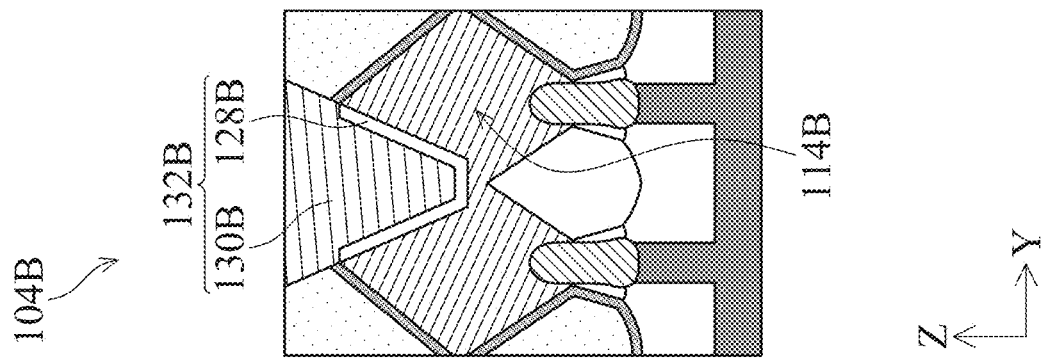
Figure 13D:
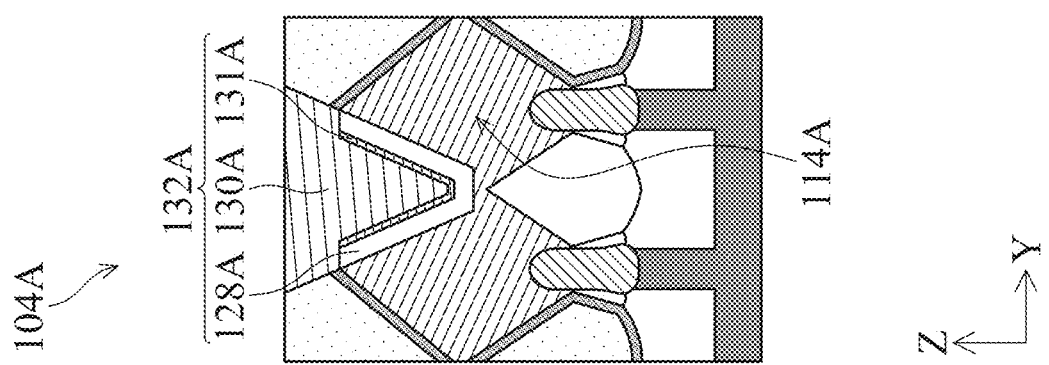

Referring to FIG. 3, in operation 390, conductive regions of S/D contact structures can be formed in the S/D contact openings of the NFET and PFET. For example, as shown in FIGS. 13A-13D, conductive regions 130A-130B of S/D contact structures 132A-132B of NFET 104A and PFET 104B can be formed in S/D contact openings of 846A-846B, respectively. Prior to the formation of conductive regions 130A and 130B, oxide capping layers 948B* on p-type epitaxial fin regions 114B can be removed by a dry etching process. The dry etching process can be similar to the dry etching process for the cleaning process. In some embodiments, the dry etching process can be a fluorine-based process. In some embodiments, the dry etching process can be performed using a gas mixture including ammonia ($NH_3$) and nitrogen trifluoride ($NF_3$) at a temperature from about 30° C. to about 200° C. The gas ratio of $NF_3$ to $NF_3$ in the gas mixture can range from about 1 to about 6. In some embodiments, the dry etching process can include the SiCoNi etch process. After the dry etching process, oxide capping layers 948B* can be removed to expose the surfaces of p-type epitaxial fin regions 114B within S/D contact openings 846B as shown in FIGS. 12B and 12D.

Following the removal of oxide capping layers 948B*, a high work function metal layer can be blanket deposited on the structures of FIGS. 12A-12D. The portions of the blanket deposited high work function metal layer within S/D contact openings 846A can form conductive regions 130A and the portions of the blanket deposited high work function metal layer within S/D contact openings 846B can form conductive regions 130B. Conductive regions 130B can be deposited directly on p-type epitaxial fin regions 114B without a conductive liner (referred to as barrier-less metal layer). In some embodiments, conductive regions 130A-130B can be formed with one or more high work function metals, such as Ru, Co, Ni, Ir, Rh, and/or other suitable high work function metals. The high work function metal layer can be blanket deposited by CVD, ALD, and/or other suitable deposition methods (referred to as barrier-less CVD and barrier-less ALD). The blanket deposition temperature can range from about 120° C. to about 210° C. In some embodiments, conductive regions 130A-130B can have vertical dimensions (e.g., height) 130At-130Bt, respectively, along a Z-axis ranging from about 30 nm to about 50 nm. In some embodiments, dimensions 130At-130Bt can be different from each other. Based on the disclosure herein, it will be recognized that other materials, deposition methods, deposition temperatures, and dimensions for conducive regions 130A-130B are within the scope and spirit of this disclosure. The blanket deposition of the high work function metal layer for conductive regions 130A-130B can be followed by a CMP process to coplanarize top surfaces of conductive regions 130A and 130B with the top surface of ILD layer 136. In some embodiments, the CMP process, can use a silicon or an aluminum abrasive with abrasive concentrations ranging from about 0.1% to about 3%.

Following the blanket deposition of the high work function metal layer or the CMP of the high work function metal layer, an RTA process can be performed on conductive regions 130A-130B to form metal silicide layers 128B of S/D contact structures 132B of PFET 104B. In some embodiments, a thickness of metal silicide layers 128B can range from about 2 nm to about 6 nm. In some embodiments, metal silicide layers 128B can include a silicide of the high work function metal layer deposited within S/D contact openings 846B, such as RuSi, CoSi, NiSi, IrSi, Rh Si, and/or other suitable high work function metal silicides. In some embodiments, the CMP of the high work function metal layer can be performed after the formation of metal silicide layers 128B. In some embodiments, the RTA process to form metal silicide layers 128B can be optional. Based on the disclosure herein, it will be recognized that other annealing processes, materials, and dimensions for metal silicide layers 128B are within the scope and spirit of this disclosure.

The above embodiments describe structures and methods for fabricating a semiconductor device 100 with dual silicide S/D contact structures 132A-132B without using additional mask layers compared to the fabrication process for semiconductor devices with single silicide S/D contact structures. Dual silicide S/D contact structures 132A-132B can reduce SBH and S/D contact resistance of both NFET 104A and PFET 104B of semiconductor device 100. According to some embodiments, first silicide contact structures 132A can be selectively formed on S/D regions 114A of NFET 104A by using an oxide capping layer 948B* on PFET 104B. Subsequently, second silicide contact structures 132B that are different from the first silicide contact structures 132A can be formed on S/D regions 114B of PFET 104B after the removal of oxide capping layer 948B*. The first silicide contact structures can have silicide layers of a low work function metal (e.g., Ti, Ta, Er, Y, or Yb) and the second silicide contact structures can have silicide layers of a high work function metal (e.g., Ru, Co, Ni, Ir, or Rh) to achieve low SBHs and low S/D contact resistances in both NFET 104A and PFET 104B. The method of forming dual silicide contact structures 132A-132B using the oxide capping layer can have the following benefits: (i) selective formation of low work function metal based silicide contact structures 132A on NFET 104A and high work function metal based silicide contact structures 132B on PFET 104B for low SBHs and thus low contact resistance of the FET devices; (ii) compatibility with the fabrication process of semiconductor devices with single silicide contact structures without the need for additional mask layers; and (iii) reduced cost and complexity of the semiconductor manufacturing processes compared to the processes for forming dual silicide contact structures using additional mask layers.

In some embodiments, a method of fabricating a semiconductor device includes forming first and second fin structures on a substrate, forming first and second epitaxial regions on the first and second fin structures, respectively, forming first and second contact openings on the first and second epitaxial regions, respectively, selectively forming an oxide capping layer on exposed surfaces of the second epitaxial region within the second contact opening, selectively forming a first metal silicide layer on exposed surfaces of the first epitaxial region within the first contact opening, removing the oxide capping layer, and forming first and second conductive regions on the metal silicide layer and on the exposed surfaces of the second epitaxial region within the second contact opening, respectively. The first epitaxial region has a material composition different from the second epitaxial region, the first metal silicide layer has a first metal, and the first and second conductive regions have a second metal different from the first metal.

In some embodiments, a method of fabricating a semiconductor device includes forming first and second source/drain (S/D) regions on a substrate, forming first and second contact openings on the first and second S/D regions, respectively, selectively forming an oxide capping layer on exposed surfaces of the second S/D region within the second contact opening, selectively forming a metal silicide layer on exposed surfaces of the first S/D region within the first contact opening, selectively forming a metal capping layer on the metal silicide layer, removing the oxide capping layer, and forming first and second conductive regions on the metal capping layer and on the exposed surfaces of the second epitaxial region within the second contact opening, respectively. The first S/D region has a material composition different from the second S/D region, the metal silicide layer has a first metal, and the first and second conductive regions have a second metal different from the first metal.

In some embodiments, a semiconductor device includes first and second fin structures on a substrate, first and second epitaxial regions on the first and second fin structures, respectively, a first contact structure disposed on the first epitaxial region, and a second contact structure disposed on the second epitaxial region. The first epitaxial region has a material composition different from the second epitaxial region. The first contact structure includes a first metal silicide layer disposed on the first epitaxial region, a metal capping layer disposed on the metal silicide layer, and a first conductive region disposed on the metal capping layer. The first metal silicide layer has a first metal. The second contact structure includes a second metal silicide layer disposed on the second epitaxial region and a second conductive region disposed on the second metal silicide layer. The second metal silicide layer has a second metal that is different from the first metal.

The foregoing disclosure outlines features of several embodiments so that those skilled in the art can better understand the aspects of the present disclosure. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions, and alterations herein without departing from the spirit and scope of the present disclosure.

What is claimed is:

1. A method of fabricating a semiconductor device, the method comprising:
   forming first and second fin structures on a substrate;
   forming first and second source/drain (S/D) regions on the first and second fin structures, respectively, wherein the first S/D region has a material composition different from the second S/D region;
   forming first and second contact openings on the first and second S/D regions, respectively, to simultaneously expose surfaces of the first and second S/D regions;
   selectively forming an oxide capping layer on the exposed surfaces of the second S/D region within the second contact opening;
   selectively forming a first metal silicide layer on the exposed surfaces of the first S/D region within the first contact opening, wherein the first metal silicide layer comprises a first metal;
   removing the oxide capping layer; and
   forming first and second conductive regions on the metal silicide layer and on the exposed surfaces of the second S/D region within the second contact opening, respectively, wherein the first and second conductive regions comprise a second metal different from the first metal.

2. The method of claim 1, wherein the selectively forming the oxide capping layer comprises:
   forming first and second oxide layers in contact with the exposed surfaces of the first and second S/D regions; and
   performing a cleaning process on the first and second oxide layers to remove the first oxide layer.

3. The method of claim 2, wherein the forming the first and second oxide layers comprises simultaneously oxidizing the exposed surfaces of the first and second S/D regions within the first and second contact openings, respectively.

4. The method of claim 2, wherein the forming the first and second oxide layers comprises oxidizing the exposed surfaces of the first and second S/D regions within the first and second contact openings, respectively, at different oxidation rates, and
   wherein a ratio of the oxidation rates between the second oxide layer and the first oxide layer ranges from about 3 to about 10.

5. The method of claim 2, wherein the forming the first and second oxide layers comprises growing the second oxide layer thicker than the first oxide layer.

6. The method of claim 2, wherein the performing the cleaning process on the first and second oxide layers comprises:
    removing the first oxide layer; and
    thinning down the second oxide layer to form the oxide capping layer.

7. The method of claim 1, wherein the selectively forming the first metal silicide layer comprises selectively depositing a layer of the first metal on the exposed surfaces of the first S/D region within the first contact opening, wherein the first metal has a work function value lower than a work function value of the second metal.

8. The method of claim 7, wherein the selectively forming the first metal silicide layer comprises rapid thermal annealing the layer of the first metal.

9. The method of claim 1, further comprising forming a second metal silicide layer between the second conductive region and the second S/D region, wherein the second metal silicide layer comprises the second metal.

10. The method of claim 9, wherein the forming the second metal silicide layer comprises rapid thermal annealing the second conductive region.

11. A method of fabricating a semiconductor device, the method comprising:
    forming first and second source/drain (S/D) regions on a substrate, wherein the first S/D region has a material composition different from the second S/D region;
    forming first and second contact openings on the first and second S/D regions to expose surfaces of the first and second S/D regions, respectively;
    oxidizing exposed surfaces of the first and second S/D regions at different oxidation rates;
    etching oxidized surfaces of the first and second S/D regions to selectively form an oxide capping layer on the exposed surfaces of the second S/D region within the second contact opening;
    selectively forming a metal silicide layer on the exposed surfaces of the first S/D region within the first contact opening, wherein the metal silicide layer comprises a first metal;
    selectively forming a metal capping layer on the metal silicide layer;
    removing the oxide capping layer; and
    forming first and second conductive regions on the metal capping layer and on the exposed surfaces of the second S/D region within the second contact opening, respectively, wherein the first and second conductive regions comprise a second metal different from the first metal.

12. The method of claim 11, wherein the forming the metal capping layer comprises:
    selectively depositing a layer of the first metal on the exposed surfaces of the first S/D region within the first contact opening, wherein the first metal has a work function value lower than a work function value of the second metal;
    selectively depositing a layer of metal nitride or metal silicon nitride on the layer of the first metal; and
    rapid thermal annealing the layer of the first metal and the layer of metal nitride or metal silicon nitride.

13. The method of claim 11, wherein the etching the oxidized surfaces of the first and second S/D regions comprises:
    performing a cleaning process on the oxidized surfaces of the first and second S/D regions to remove the oxidized surfaces on the first S/D region.

14. The method of claim 11, wherein the oxidizing the exposed surfaces of the first and second S/D regions comprises growing a first oxide layer on the first S/D region and a second oxide layer on the second S/D region, the second oxide layer being thicker than the first oxide layer.

15. The method of claim 11, wherein the forming the second conductive region comprises depositing a layer of the second metal within the second contact opening in contact with the second S/D region without a conductive liner on sidewalls of the second contact opening.

16. A method, comprising:
    forming first and second fin structures on a substrate;
    forming first and second source/drain (S/D) regions on the first and second fin structures, respectively, wherein the first S/D region has a material composition different from the second S/D region;
    forming first and second contact openings simultaneously on the first and second S/D regions, respectively wherein the first and second S/D regions are exposed;
    selectively forming an oxide capping layer on exposed surfaces of the second S/D region within the second contact opening;
    selectively forming a first metal silicide layer on exposed surfaces of the first S/D region within the first contact opening, wherein the first metal silicide layer comprises a first metal;
    selectively forming a metal capping layer on the first metal silicide layer;
    removing the oxide capping layer;
    forming first and second conductive regions on the metal capping layer and on the exposed surfaces of the second S/D region within the second contact opening, respectively, wherein the first and second conductive regions comprise a second metal different from the first metal; and
    forming a second metal silicide layer between the second conductive region and the second S/D region, wherein the second metal silicide layer comprises the second metal.

17. The method of claim 16, wherein the forming the metal capping layer comprises:
    selectively depositing a layer of the first metal on the exposed surfaces of the first S/D region within the first contact opening, wherein the first metal has a work function value lower than a work function value of the second metal;
    selectively depositing a layer of metal nitride or metal silicon nitride; and
    rapid thermal annealing the layer of the first metal and the layer of metal nitride or metal silicon nitride.

18. The method of claim 16, wherein the selectively forming the oxide capping layer comprises:
    forming first and second oxide layers in contact with the exposed surfaces of the first and second S/D regions, wherein the second oxide layer is thicker than the first oxide layer; and
    performing a cleaning process on the first and second oxide layers to remove the first oxide layer and a portion of the second oxide layer to remove the first oxide layer.

19. The method of claim 18, wherein the forming the first and second oxide layers comprises oxidizing the exposed surfaces of the second S/D region within the second contact opening at a higher oxidation rate than that of the exposed surfaces of the first S/D region within the first contact opening.

20. The method of claim 16, wherein the forming the second conductive region comprises depositing a layer of the second metal within the second contact opening in contact with the second S/D region and on sidewalls of the second contact opening.

\* \* \* \* \*